US011855375B2

(12) United States Patent
Fujimura et al.

(10) Patent No.: US 11,855,375 B2
(45) Date of Patent: Dec. 26, 2023

(54) POWER CONVERSION DEVICE AND COMPONENT INTERCONNECTION STRUCTURE

(71) Applicant: Panasonic Intellectual Property Management Co., Ltd., Osaka (JP)

(72) Inventors: Motohiko Fujimura, Kanagawa (JP); Toshihiko Bessho, Kanagawa (JP); Eiji Nishimura, Kanagawa (JP); Shinya Kimura, Tokyo (JP); Shigeru Nakabayashi, Kanagawa (JP); Manabu Egawa, Kanagawa (JP); Hiroshi Ogura, Tokyo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 213 days.

(21) Appl. No.: 17/389,545

(22) Filed: Jul. 30, 2021

(65) Prior Publication Data

US 2022/0069501 A1 Mar. 3, 2022

(30) Foreign Application Priority Data

Aug. 31, 2020 (JP) ................................ 2020-145220
May 14, 2021 (JP) ................................ 2021-082741

(51) Int. Cl.

| | |
|---|---|
| ***H01R 13/11*** | (2006.01) |
| ***H02M 3/00*** | (2006.01) |
| ***H01R 12/70*** | (2011.01) |
| ***H01R 12/71*** | (2011.01) |
| ***H01R 13/05*** | (2006.01) |

(52) U.S. Cl.

CPC ......... *H01R 13/112* (2013.01); *H01R 12/707* (2013.01); *H01R 12/718* (2013.01);

(Continued)

(58) Field of Classification Search

CPC .. H01R 13/112; H01R 12/707; H01R 12/718; H01R 13/055; H01R 13/113;

(Continued)

(56) References Cited

U.S. PATENT DOCUMENTS 6,918,800 B2 * 7/2005 Ota ........................ H01R 13/03 439/886
6,974,344 B2 * 12/2005 Comerci .............. H01R 12/772 439/329

(Continued)

FOREIGN PATENT DOCUMENTS

JP 6-88193 U 12/1994
JP 2000-014128 A 1/2000

(Continued)

OTHER PUBLICATIONS

Japanese Office Action, dated Jun. 28, 2022, for Japanese Patent Application No. 2021-082741. (10 pages) (with English Translation).

(Continued)

*Primary Examiner* — Travis S Chambers
(74) *Attorney, Agent, or Firm* — Seed IP Law Group LLP

(57) ABSTRACT

A power conversion device includes first and second components and pairs of engagement members each including male and female engagement members. The male engagement member includes an insertion part having a substantially flat plate shape. The female engagement member includes first and second clamping parts arranged to be opposed to each other. In each of the pairs of engagement members, the male and female engagement members are respectively arranged on one and another of the first and second components. The first and second components are coupled when the female engagement member clamps the insertion part inserted between the first and second clamping parts in each of the pairs of engagement members. Each of (Continued)

the first and second clamping parts is bent to form a projecting portion toward an opposed surface. A gap is provided at a distal end of each of the first and second clamping parts.

16 Claims, 19 Drawing Sheets

(52) U.S. Cl.
CPC ......... *H01R 13/055* (2013.01); *H01R 13/113* (2013.01); *H02M 3/003* (2021.05)

(58) Field of Classification Search
CPC ...... H01R 12/73; H01R 12/57; H01R 13/115; H01R 12/712; H01R 13/04; H01R 13/11; H02M 3/003; H02M 7/003; H05K 2201/042; H05K 2201/10189; H05K 1/144; H05K 1/14; H05K 1/18
See application file for complete search history.

(56) References Cited

U.S. PATENT DOCUMENTS

| | | | | |
|---|---|---|---|---|
| 8,298,022 | B2 * | 10/2012 | Tsuruta | H01R 13/4365 439/948 |
| 9,711,897 | B2 * | 7/2017 | Ho | H01R 13/631 |
| 11,388,844 | B2 | 7/2022 | Tazaki et al. | |
| 2006/0030191 | A1 | 2/2006 | Tuin et al. | |
| 2011/0039456 | A1 | 2/2011 | Katano | |
| 2016/0037654 | A1 | 2/2016 | Kosuga et al. | |
| 2016/0126654 | A1 | 5/2016 | Hashiguchi et al. | |
| 2016/0254633 | A1 * | 9/2016 | Miyakawa | H01R 13/187 439/843 |
| 2022/0328996 | A1 * | 10/2022 | Mastel | H01R 13/44 |

FOREIGN PATENT DOCUMENTS

| | | | |
|---|---|---|---|
| JP | 2001143799 | A | 5/2001 |
| JP | 2006019296 | A | 1/2006 |
| JP | 2006-191763 | A | 7/2006 |
| JP | 2010267496 | A | 11/2010 |
| JP | 2014-176271 | A | 9/2014 |
| JP | 2016091767 | A | 5/2016 |
| JP | 2018-133481 | A | 8/2018 |
| JP | 2020145127 | A | 9/2020 |
| WO | 2019131620 | A1 | 7/2019 |

OTHER PUBLICATIONS

Masago, et al., “Tin Plated Copper Alloy Materials for Connectors,” *Kobe Steel Engineering Reports* 59(1):133-136, 2009. (with English translation).

* cited by examiner

| CROSS-SECTIONAL VIEW | A-A' VIEW FROM ABOVE | |
|---|---|---|
| | BASIC | ROTATED |
|   | 31 11 31<br>21a (21)<br>22a (22)<br>21b (21)<br>22b (22)<br>31 31 | 31 11<br>D<br>31<br>21a (21)<br>22a (22)<br>R<br>21b (21)<br>22b (22)<br>31 31 |

| CROSS-SECTIONAL VIEW | A-A' VIEW FROM ABOVE | |
| --- | --- | --- |
| | BASIC | ROTATED |
| 11<br>A<br>A'<br>22<br>32<br>32<br>21 | G<br>11<br>21a (21)<br>22a (22)<br>21b (21)<br>22b (22)<br>321<br>32<br>G | G<br>11<br>D<br>21a (21)<br>22a (22)<br>R<br>21b (21)<br>22b (22)<br>321<br>32<br>G |

(a)
PCB2
40
15
Bm
11
13
Bf
PCB1
(b)
PCB2
40
15
11
Bm
13
20
Bf
PCB3
40
25
Bf
20
13
Bm
11
PCB1

PCB1
PCB2
PCB3
PCB4
D1
D2
B
B
B
B
Coil
RL
Cap
Cap
TR
WJ
MOSFET1
MOSFET2
45
45
45
45
45

POWER CONVERSION DEVICE AND COMPONENT INTERCONNECTION STRUCTURE

CROSS-REFERENCE TO RELATED APPLICATIONS

This application is based upon and claims the benefit of priority from Japanese Patent Application No. 2020-145220, filed on Aug. 31, 2020 and Japanese Patent Application No. 2021-082741, filed on May 14, 2021, the entire contents of which are incorporated herein by reference.

FIELD

Embodiments described herein relate generally to a power conversion device and a component interconnection structure.

BACKGROUND

In the related art, a power conversion device mounted on an electric vehicle and the like is provided with a plurality of circuit boards on which a circuit configuration such as a DC/DC converter and an inverter is implemented. There has been a demand for downsizing of such a power conversion device in view of mountability on a vehicle, for example.

In such a situation, there is known a technology of downsizing the power conversion device while maintaining an implementation area on a plurality of circuit boards by laminating the circuit boards. In such a power conversion device, components such as circuit boards may be electrically interconnected by engaging engagement parts such as connectors provided on the components. Conventional technologies are described in Japanese Patent Application Laid-open No. 2000-14128, for example.

However, in a case in which accuracy in implementing the engagement part on each component is decreased, there has been the possibility that engagement parts are not appropriately engaged with each other at an assembling step of the power conversion device, and a fault may be caused in electrical connection between the components.

The present disclosure provides a power conversion device and a component interconnection structure that can expand a geometric permissible range of the engagement part that electrically interconnects the components.

SUMMARY

A power conversion device according to the present disclosure includes a first component, a second component, and a plurality of pairs of engagement members. The plurality of pairs of engagement members each include: a male engagement member including an insertion part having a substantially flat plate shape and a female engagement member including a first clamping part and a second clamping part that are arranged to be opposed to each other. In each of the plurality of pairs of engagement members, the male engagement member is arranged on one of the first and second components, and the female engagement member is arranged on another of the first and second components. The first and second components are coupled to each other when the female engagement member clamps the insertion part of the male engagement member inserted between the first and second clamping parts in each of the plurality of pairs of engagement members. Each of the first and second clamping parts is bent to form a projecting portion toward an opposed surface, and a gap is provided at a distal end of each of the first and second clamping parts.

DETAILED DESCRIPTION

The following describes embodiments of a power conversion device, a component interconnection structure, and a component interconnection method according to the present disclosure with reference to the drawings.

First Embodiment

By way of example, a power conversion device according to an embodiment is a vehicle-mounted charger that is mounted on an electric vehicle and the like, converts AC power supplied from a power supply (external power supply) into DC power at a predetermined voltage, and outputs the DC power after conversion to a battery such as a lithium ion battery. Such a power conversion device includes a plurality of circuit boards mounted thereon, the circuit boards on which a circuit configuration such as a DC/DC converter and an inverter is implemented.

Figure 1:
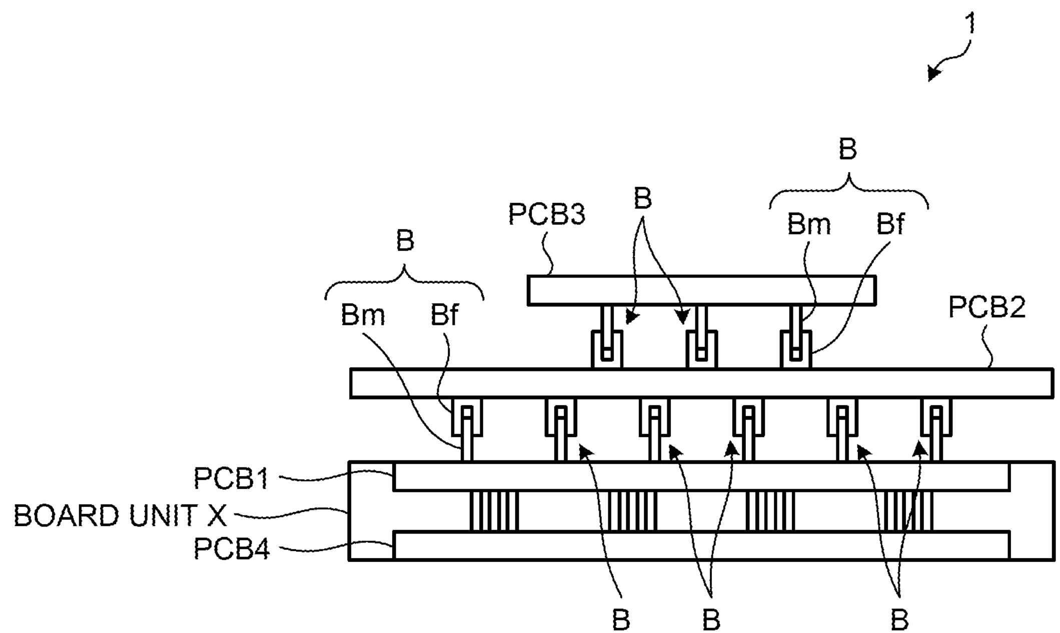
FIG. 1 is a schematic cross-sectional view illustrating an example of a layered structure of a plurality of circuit boards in a power conversion device according to a first embodiment.

FIG. 1 is a schematic cross-sectional view illustrating an example of a layered structure of a plurality of circuit boards in a power conversion device 1 according to the embodiment. FIG. 1 exemplifies a first board PCB1, a second board PCB2, a third board PCB3, and a fourth board PCB4 among the circuit boards included in the power conversion device 1.

Each of the first board PCB1, the second board PCB2, the third board PCB3, and the fourth board PCB4 is a printed circuit board (PCB). By way of example, the printed circuit board is a glass epoxy board made of an aluminum alloy or a copper alloy as a base material. By bringing part of the aluminum alloy or the copper alloy of the printed circuit board into contact with a water-cooled stand to be able to exchange heat, a temperature rise in an electronic component mounted on the printed circuit board can be suppressed. By using the printed circuit board made of metal as a base material, cooling efficiency can be improved as compared with a case of using a printed circuit board made of resin as a base material.

The first board PCB1 is coupled to the second board PCB2 via a plurality of pairs of engagement members B. In the following description, the pairs of engagement members B may be referred to as multiple pairs of engagement members B in some cases. The pair of engagement members B may be represented as an engagement part in some cases. The first board PCB1 is electrically connected to the second board PCB2, and outputs, to a battery and the like, electric power corresponding to electric power supplied from the second board PCB2. The first board PCB1 is electrically connected to the fourth board PCB4, and configures a board unit X. A plurality of male engagement members Bm are mounted on a principal plane of the first board PCB1 on the second board PCB2 side. By way of example, the first board PCB1 includes twenty-four male engagement members Bm mounted thereon.

The first board PCB1 is also coupled to a transformer unit (not illustrated) via the pair of engagement members B. By way of example, the first board PCB1 includes twelve male engagement members Bm or female engagement members Bf mounted thereon for an electrical connection with the transformer unit. Alternatively, the first board PCB1 and the fourth board PCB4 of the board unit X can be coupled to each other via the multiple pairs of engagement members B according to the embodiment. That is, a board interconnection structure according to the embodiment may be applied to coupling between boards in a board unit such as the board unit X, may be applied to coupling between board units, or may be applied to coupling between the board unit and a board outside the board unit.

The second board PCB2 is coupled to each of the first board PCB1 and the third board PCB3 via the multiple pairs of engagement members B. The second board PCB2 is electrically connected to each of the first board PCB1 and the third board PCB3, and outputs, to the first board PCB1, electric power corresponding to electric power supplied from the third board PCB3. The female engagement members Bf are mounted on each of a principal plane of the second board PCB2 on the first board PCB1 side and a principal plane of the second board PCB2 on the third board PCB3 side.

The third board PCB3 is coupled to the second board PCB2 via the multiple pairs of engagement members B. The third board PCB3 is electrically connected to an external power supply, for example, and receives electric power input from the external power supply. The male engagement members Bm are mounted on a principal plane of the third board PCB3 on the second board PCB2 side. By way of example, the third board PCB3 includes six male engagement members Bm mounted thereon.

Only some of the circuit boards included in the power conversion device 1 may be caused to be printed circuit boards. For example, at least one of the first board PCB1, the second board PCB2, and the third board PCB3 can be caused to be the printed circuit board. The connection between the circuit boards via the pair of engagement members B is not necessarily an electrical connection. However, the embodiment mainly exemplifies a case in which two circuit boards are electrically coupled to each other via the multiple pairs of engagement members B.

The embodiment exemplifies a case in which the male engagement members Bm are arranged on the first board PCB1 and the third board PCB3, and the female engagement members Bf are arranged on both principal planes of the second board PCB2. However, the embodiment is not limited thereto. For example, the female engagement members Bf may be arranged on the first board PCB1 and the third board PCB3, and the male engagement members Bm may be arranged on both principal planes of the second board PCB2.

Alternatively, for example, the configuration may be made such that the male engagement members Bm are arranged on one of the principal planes of the second board PCB2, and the female engagement members Bf are arranged on the other one of the principal planes of the second board PCB2. That is, in a case in which the circuit boards of the power conversion device 1 form a layered structure including three or more layers, the male engagement members Bm or the female engagement members Bf are arranged on both principal planes of the board forming an intermediate layer.

Alternatively, for example, the configuration may be made such that the male engagement members Bm and the female engagement members Bf are arranged on one principal plane of each of the first board PCB1, the second board PCB2, and the third board PCB3.

In this way, the two circuit boards of at least two laminated circuit boards are coupled to each other via the multiple pairs of engagement members B in the power conversion device 1 according to the embodiment. Each of the multiple pairs of engagement members B includes the male engagement member Bm and the female engagement member Bf. That is, the multiple pairs of engagement members B are a plurality of sets of pairs of engagement members B. Each of the multiple pairs of engagement members B, that is, the pair of engagement members B is a set of the male engagement member Bm and the female engagement member Bf. In this case, one member of the multiple pairs of engagement members B is arranged on each of the principal planes opposed to each other of the two laminated circuit boards. Specifically, as described above, among the multiple pairs of engagement members B, the male engagement member Bm is arranged on one of the two laminated circuit boards, and the female engagement member Bf is arranged on the other one of the two laminated circuit boards. As described above, by way of example, only one of the male engagement member Bm and the female engagement member Bf is arranged on each of the two circuit boards coupled by engagement of the multiple pairs of engagement members B. By way of another example, at least one male engagement member Bm and at least one female engagement member Bf are arranged on each of the two circuit boards coupled by engagement of the multiple pairs of engagement members B. The male engagement member Bm is a blade-shaped connector (plug) for inserting. The male engagement member Bm can also be represented as a flat plug blade. The female engagement member Bf is a connector (receptacle) for being inserted. The female engagement member Bf can also be represented as a blade receiving spring.

Figure 2:
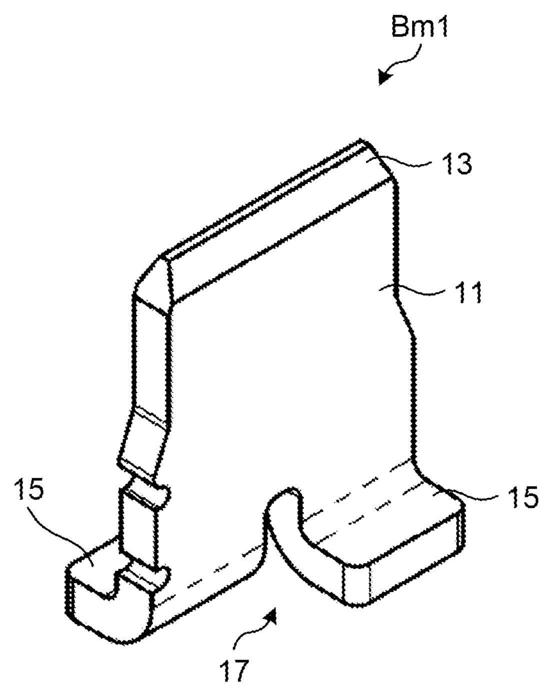
FIG. 2 is a schematic perspective view illustrating an example of a configuration of a male engagement member in FIG. 1.

FIG. 2 is a schematic perspective view illustrating an example of a configuration of the male engagement member Bm in FIG. 1. A male engagement member Bm1 in FIG. 2 is an example of the male engagement member Bm according to the embodiment.

An insertion part 11 of the male engagement member Bm1 has a substantially flat plate shape. A distal end 13 of the insertion part 11 is chamfered, and a thickness thereof is reduced as coming closer to a distal end side. Due to this, the insertion part 11 can be easily inserted into a reception part 20 of the female engagement member Bf. Connection parts 15 of the insertion part 11 are on a rear end side of the insertion part 11 divided into two parts by a gap 17. The connection parts 15, that is, each of the divided parts on the rear end side of the insertion part 11 is bent in a substantially vertical direction with respect to the insertion part 11. The connection part 15 is soldered to a predetermined position on the PCB board, and electrically connects between the insertion part 11 and wiring on the PCB board. The insertion part 11 and the connection part 15 can be formed by bending one metal plate material, for example.

Figure 3:
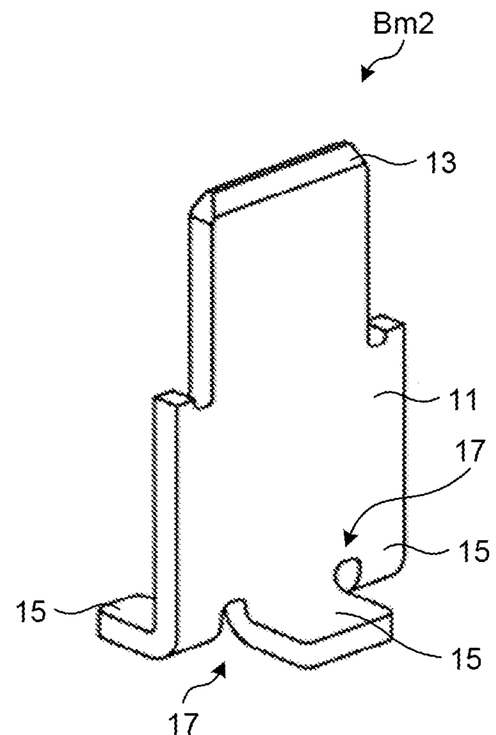
FIG. 3 is a schematic perspective view illustrating another example of the configuration of the male engagement member in FIG. 1.

FIG. 3 is a schematic perspective view illustrating another example of the configuration of the male engagement member Bm in FIG. 1. A male engagement member Bm2 in FIG. 3 is an example of the male engagement member Bm according to the embodiment. The following mainly describes points of difference from the male engagement member Bm1.

A length from the distal end 13 of the insertion part 11 to the connection part 15 of the male engagement member Bm2 is larger than that of the male engagement member Bm1. On the other hand, a width and a thickness of the insertion part 11 of the male engagement member Bm2 are substantially the same as those of the male engagement member Bm1. The connection parts 15 of the insertion part 11 are on the rear end side of the insertion part 11 divided into three parts by gaps 17.

The number of divided parts on the rear end side of the insertion part 11 of the male engagement members Bm1 and Bm2 can be optionally designed so long as the number of divided parts is two or more. By way of example, the number of divided parts is increased as the length of the insertion part 11 is increased.

Figure 4:
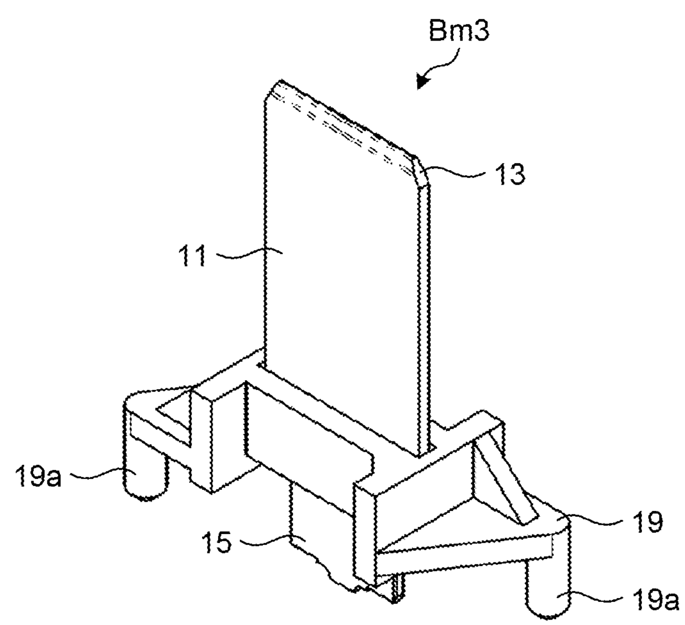
FIG. 4 is a schematic perspective view illustrating another example of the configuration of the male engagement member in FIG. 1.

FIG. 4 is a schematic perspective view illustrating another example of the configuration of the male engagement member Bm in FIG. 1. A male engagement member Bm3 in FIG. 4 is an example of the male engagement member Bm according to the embodiment. The following mainly describes points of difference from the male engagement members Bm1 and Bm2.

The connection part 15 of the insertion part 11 is on the rear end side of the insertion part 11 similarly to the male engagement members Bm1 and Bm2 described above. On the other hand, the rear end side of the insertion part 11 is not divided unlike the male engagement members Bm1 and Bm2. On a side closer to the distal end than the connection part 15 of the insertion part 11, a support member 19 supporting the insertion part 11 is arranged. The support member 19 is made of a polyphthalamide resin (PPA), for example, but may be configured by any non-conductive material. The support member 19 may be made of polyamide (PA), for example. The support member 19 includes an insertion part 19*a*. The insertion part 19*a* is inserted into a hole arranged at a predetermined position on the PCB board. Due to this, a position at which the male engagement member Bm3 is implemented on the PCB board can be defined, so that accuracy in implementing the male engagement member Bm3 can be improved. FIG. 4 exemplifies the support member 19 on which two insertion parts 19*a* are formed, but the embodiment is not limited thereto. The support member 19 may include three or more insertion parts 19*a*.

Figure 5:
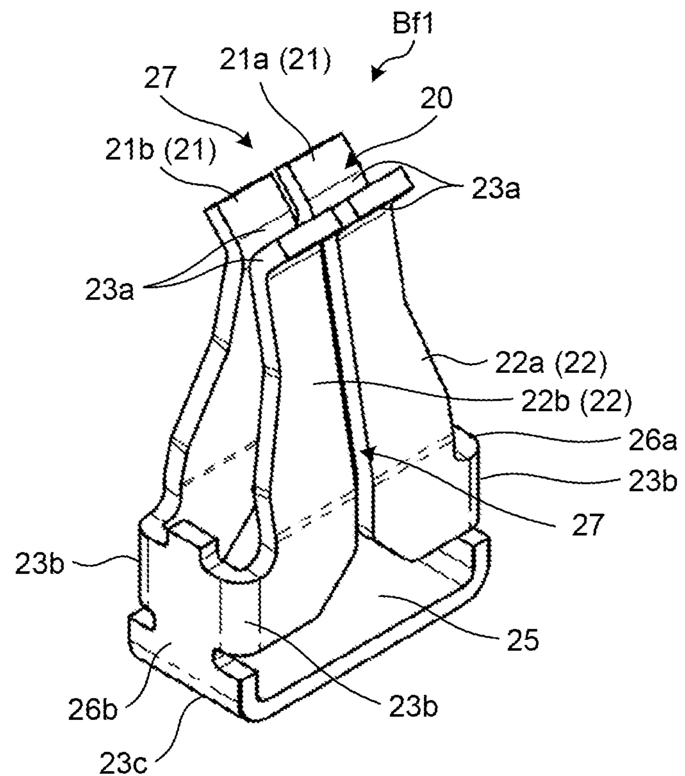
FIG. 5 is a schematic perspective view illustrating an example of a configuration of a female engagement member in FIG. 1.

FIG. 5 is a schematic perspective view illustrating an example of a configuration of the female engagement member Bf in FIG. 1. A female engagement member Bf1 in FIG. 5 is an example of the female engagement member Bf according to the embodiment. The female engagement member Bf1 clamps the insertion part 11 of the male engagement member Bm inserted into the reception part 20. The female engagement member Bf1 is formed by bending one metal plate material, for example. The female engagement member Bf1 has a substantially Y-shape such that the distal end side thereof is opened when viewed from a side surface side, that is, a side of a first base 26*a* or a second base 26*b*.

Specifically, the female engagement member Bf includes a first clamping part 21 and a second clamping part 22. The first clamping part 21 and the second clamping part 22 are arranged to be opposed to each other. A surface of the first clamping part 21 opposed to the second clamping part 22 and a surface of the second clamping part 22 opposed to the first clamping part 21 form the reception part 20. That is, the first clamping part 21 and the second clamping part 22 are opposed to each other across the reception part 20. The female engagement member Bf clamps the insertion part 11 of the male engagement member Bm inserted into the reception part 20 between the first clamping part 21 and the second clamping part 22. The first clamping part 21 is bent in a shape of projecting toward the opposed second clamping part 22 at a first bending part 23*a*. Similarly, the second clamping part 22 is bent in a shape of projecting toward the opposed first clamping part 21 at the first bending part 23*a*. In other words, each of the first clamping part 21 and the second clamping part 22 is bent to form a projecting portion toward the opposed surface at the first bending part 23*a*. The first bending part 23*a* of the first clamping part 21 and the first bending part 23*a* of the second clamping part 22 are separated from each other via the reception part 20. A distance between the first bending part 23*a* of the first clamping part 21 and the first bending part 23*a* of the second clamping part 22 is smaller than the thickness of the insertion part 11 of the male engagement member Bm.

Gaps 27 are respectively arranged on the first clamping part 21 and the second clamping part 22 from a distal end side to a rear end side. That is, each of the first clamping part 21 and the second clamping part 22 is divided into two parts by the gap 27. In other words, the distal end of the female engagement member Bf1 is divided into four portions by the gaps 27. Specifically, the first clamping part 21 includes a first elastic portion 21*a* and a second elastic portion 21*b* divided by the gap 27. Similarly, the second clamping part 22 includes a third elastic portion 22*a* and a fourth elastic portion 22*b* divided by the gap 27. In this case, it can be also represented that the first elastic portion 21*a* and the second elastic portion 21*b* are separated from each other via the gap 27. Similarly, it can be also represented that the third elastic portion 22*a* and the fourth elastic portion 22*b* are separated from each other via the gap 27.

FIG. 5 exemplifies the female engagement member Bf that is divided into four parts by the gaps 27, but the embodiment is not limited thereto. The number of parts divided by the gaps 27 may be five or more. However, the number of divided parts of the first clamping part 21 is preferably equal to the number of divided parts of the second clamping part 22, and the number of parts divided by the gaps 27 is an even number equal to or larger than six, for example. A relative rotational position deviation between the pair of engagement members B (described later) may be caused in any direction. Thus, by causing the number of divided parts of the first clamping part 21 to be equal to the number of divided parts of the second clamping part 22, a geometric permissible range of the engagement part can be expanded irrespective of a direction of rotational position deviation.

Each of the first elastic portion 21*a* and the third elastic portion 22*a* is extended from the first base 26*a*. In other words, each of the first elastic portion 21*a* and the third elastic portion 22*a* is coupled to the first base 26*a* continuously and integrally via a second bending part 23*b*. Each of the second elastic portion 21*b* and the fourth elastic portion 22*b* is extended from the second base 26*b*. In other words, each of the second elastic portion 21*b* and the fourth elastic portion 22*b* is coupled to the second base 26*b* continuously and integrally via the second bending part 23*b*. Each of the first base 26*a* and the second base 26*b* is extended from a connection part 25 for the printed circuit board. In other words, each of the first base 26*a* and the second base 26*b* is coupled to the connection part 25 continuously and integrally via a third bending part 23*c*.

Thus, each of the first elastic portion 21*a*, the second elastic portion 21*b*, the third elastic portion 22*a*, and the fourth elastic portion 22*b* corresponds to a shape obtained by dividing the first clamping part 21 or the second clamping part 22, so that they can be independently deformed in accordance with a contact state with the insertion part 11.

Figure 6:
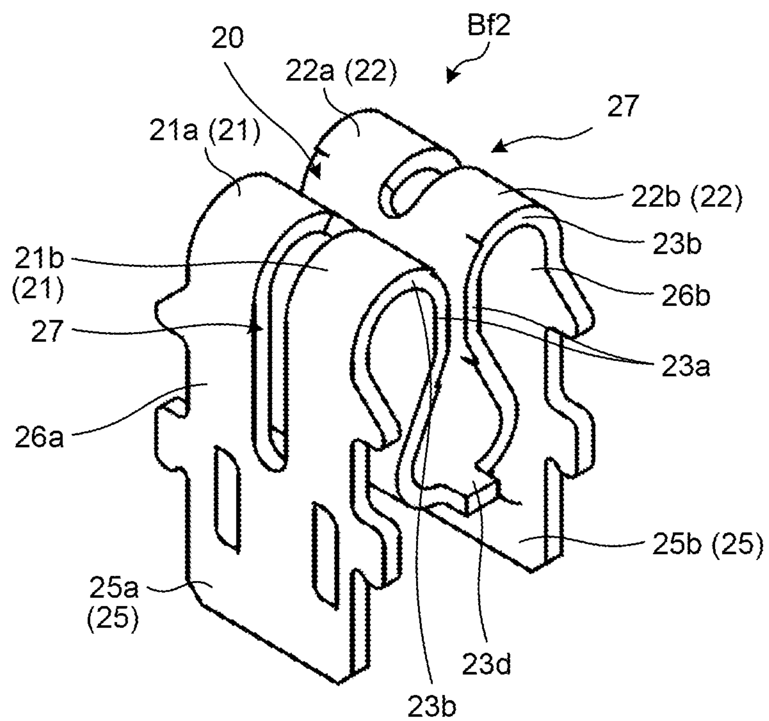
FIG. 6 is a schematic perspective view illustrating another example of the configuration of the female engagement member in FIG. 1.

FIG. 6 is a schematic perspective view illustrating another example of the configuration of the female engagement member Bf in FIG. 1. A female engagement member Bf2 in FIG. 6 is an example of the female engagement member Bf according to the embodiment. The following mainly describes points of difference from the female engagement member Bf1. The female engagement member Bf2 has a substantially M-shape when viewed from a side surface side.

The gap 27 is arranged at the distal end of each of the first clamping part 21 and the second clamping part 22. The gap 27 is arranged only at the distal end unlike the female engagement member Bf1. However, the distal end of each of the first clamping part 21 and the second clamping part 22 is divided into two parts by the gap 27 similarly to the female engagement member Bf1. In other words, the distal end of the female engagement member Bf2 is also divided into four parts by the gaps 27. In this case, it can be also represented that at least part of the first elastic portion 21*a* and at least part of the second elastic portion 21*b* are separated from each other via the gap 27. Similarly, it can be also represented that at least part of the third elastic portion 22*a* and at least part of the fourth elastic portion 22*b* are separated from each other via the gap 27.

Each of the first elastic portion 21*a* and the second elastic portion 21*b* is extended from the first base 26*a*. The first base 26*a* is extended from a first connection part 25*a* for the printed circuit board. That is, each of the first elastic portion 21*a* and the second elastic portion 21*b* is extended from the first connection part 25*a*. In other words, each of the first elastic portion 21*a* and the second elastic portion 21*b* is coupled to the first connection part 25*a* continuously and integrally via the first base 26*a*.

Each of the third elastic portion 22*a* and the fourth elastic portion 22*b* is extended from the second base 26*b*. The second base 26*b* is extended from a second connection part 25*b* for the printed circuit board. That is, each of the third elastic portion 22*a* and the fourth elastic portion 22*b* is extended from the second connection part 25*b*. In other words, each of the third elastic portion 22*a* and the fourth elastic portion 22*b* is coupled to the second connection part 25*b* continuously and integrally via the second base 26*b*.

The first connection part 25*a* and the second connection part 25*b* are separated from each other unlike the female engagement member Bf1. On the other hand, the first clamping part 21 and the second clamping part 22 are coupled to each other continuously and integrally via a fourth bending part 23*d*.

Also with this configuration, each of the first elastic portion 21*a*, the second elastic portion 21*b*, the third elastic portion 22*a*, and the fourth elastic portion 22*b* can be independently deformed in accordance with a contact state with the insertion part 11.

Each of the male engagement member Bm and the female engagement member Bf is made of metallic material. By way of example, the male engagement member Bm and the female engagement member Bf are made of copper, a copper alloy containing brass, aluminum, or an aluminum alloy.

Conductor plating is applied to a part or the entire of surface regions of the male engagement member Bm and the female engagement member Bf. As conductor plating, for example, tin plating, silver plating, or gold plating can be appropriately used.

Tin has a property of being easily alloyed with nickel that is used as primary coating of the male engagement member Bm and the female engagement member Bf. Alloying of tin and nickel proceeds as an ambient temperature increases, and a resistance value becomes equal to or larger than 1 [mΩ]. On the other hand, silver or gold is not easily alloyed with nickel, but cost is increased if silver or gold is used. When contact resistance between the male engagement member Bm and the female engagement member Bf is large, a temperature rise is caused at a contact portion between the male engagement member Bm and the female engagement member Bf. Thus, in the power conversion device 1 according to the embodiment, the contact resistance at the contact portion between the male engagement member Bm and the female engagement member Bf is caused to be equal to or smaller than 1 [mΩ]. In other words, in a state in which the pair of engagement members B are engaged with each other, the contact resistance between the insertion part 11 of the male engagement member Bm and the projecting portion of the first clamping part 21 or the second clamping part 22 is caused to be equal to or smaller than 1 [mΩ].

Magnitude of the contact resistance is defined based on a "contact pressure", "material (tin and the like on a surface)", and a "contact area". Thus, in the power conversion device 1 according to the embodiment, by way of example, the contact resistance is adjusted to be equal to or smaller than 1 [mΩ] by adjusting elastic forces of the four elastic portions of the female engagement member Bf. In other words, in the female engagement member Bf according to the embodiment, the elastic forces of the four elastic portions are designed so that the contact resistance is equal to or smaller than 1 [mΩ]. The elastic forces of the four elastic portions depend on a material (base material) and a shape of the female engagement member Bf, for example.

The insertion part 11 of the male engagement member Bm according to the embodiment has a substantially flat plate shape. The female engagement member Bf according to the embodiment is configured to be engaged with the male engagement member Bm by clamping the insertion part 11 having a substantially flat plate shape that has been inserted. Due to this, with the board interconnection structure according to the embodiment, the contact area between the pair of engagement members B can be increased as compared with a board interconnection structure that is implemented by using a male engagement member including an insertion part having a pin shape, for example, so that the contact resistance can be reduced. Reduction in the contact resistance between the pair of engagement members B contributes to suppression of heat generation or power loss in the pair of engagement members B, improvement of a degree of freedom for a shape and material of the female engagement member Bf, simplification of determination of a connection state described below, and the like.

For example, when a diameter of the pin shape is the same as the thickness of the flat plate shape, the width of the flat plate shape can be optionally set, so that the contact area of the male engagement member Bm having the flat plate shape with the female engagement member Bf can be caused to be larger than that of a male engagement member having a pin shape and the same length. For example, when cross-sectional areas of the pin shape and the flat plate shape at a cross section parallel with the board are the same, an area of a principal plane of the flat plate shape can be caused to be larger than a surface area of the pin shape having the same length by appropriately setting the thickness and the width of the flat plate shape. That is, the contact area of the male engagement member Bm having the flat plate shape with the female engagement member Bf can be caused to be larger than that of the male engagement member having the pin shape and the same length.

Herein, the thickness of the insertion part 11 is assumed to be a size in a horizontal direction of the insertion part 11 in the state illustrated in FIG. 1. The length of the insertion part 11 is assumed to be a size in a vertical direction of the insertion part 11 in the state illustrated in FIG. 1. The width of the insertion part 11 is assumed to be a size in a direction perpendicular to the drawing of the insertion part 11 in the state illustrated in FIG. 1.

An insulation part is arranged on an outer peripheral portion of the female engagement member Bf. By way of example, the insulation part is an insulator layer 31 formed on the outer peripheral portion of the female engagement member Bf (refer to FIG. 11). The insulator layer 31 may be formed by applying an insulator to the outer peripheral portion of the female engagement member Bf, or may be formed by attaching an insulating film made of an insulator to the outer peripheral portion of the female engagement member Bf. By way of example, the insulator is resin. In this case, the outer peripheral portion of the female engagement member Bf is a surface region of the female engagement member Bf excluding a region of the first clamping part 21 opposed to the second clamping part 22, a region of the second clamping part 22 opposed to the first clamping part 21, and a region of the connection part 25 being in contact with the printed circuit board (refer to FIG. 11). Due to this, in a case in which a failure occurs in engagement between the pair of the male engagement member Bm and the female engagement member Bf due to position deviation between the insertion part 11 and the reception part 20, the bad connection can be detected by electrical inspection. In this case, the electrical inspection means measurement of a resistance value via the contact portion between the male engagement member Bm and the female engagement member Bf.

Figure 7:
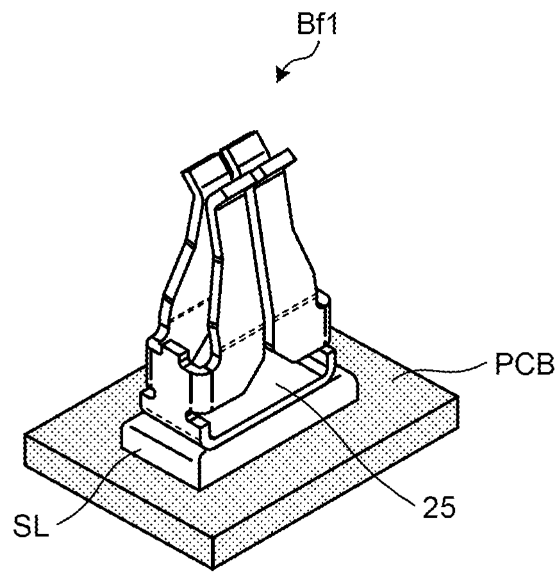
FIG. 7 is a schematic perspective view illustrating a state in which the female engagement member in FIG. 5 is implemented on a circuit board.

FIG. 7 is a schematic perspective view illustrating a state in which the female engagement member Bf1 in FIG. 5 is implemented on the circuit board. As illustrated in FIG. 7, the female engagement member Bf1 is implemented on a surface of the printed circuit board. Specifically, the connection part 25 of the female engagement member Bf1 is electrically connected to the printed circuit board by soldering via solder SL. FIG. 7 exemplifies the female engagement member Bf1, but the same applies to the male engagement members Bm1 and Bm2.

Figure 8:
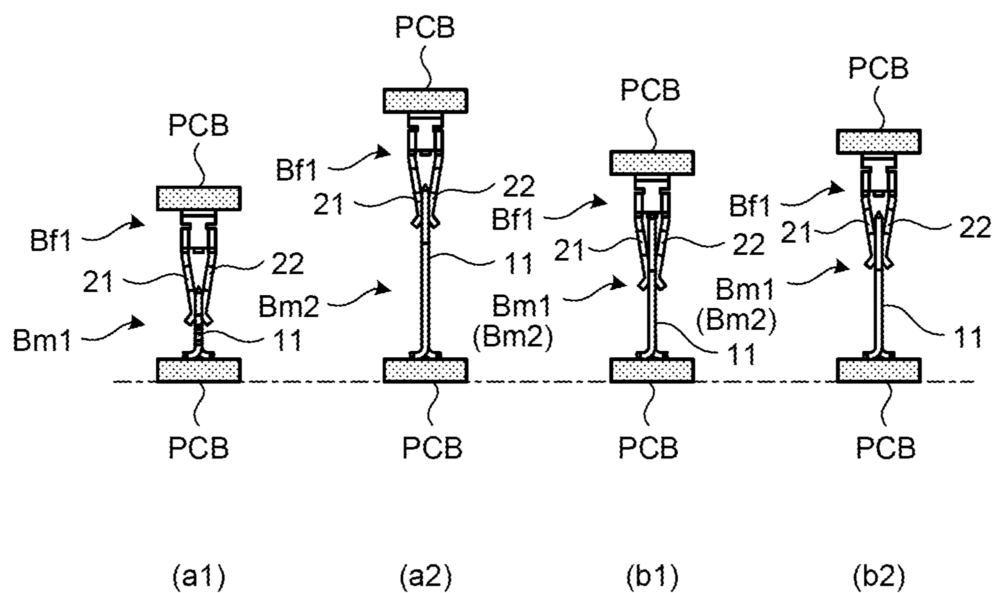
FIG. 8 is a schematic cross-sectional view illustrating an example of an engaged state of the male engagement member in FIG. 2 or FIG. 3 and the female engagement member in FIG. 5.

FIG. 8 is a schematic cross-sectional view illustrating an example of an engaged state of the male engagement member Bm in FIG. 2 or FIG. 3 and the female engagement member Bf in FIG. 5. As illustrated in FIG. 8, when the female engagement member Bf clamps the insertion part 11 of the male engagement member Bm inserted between the first clamping part 21 and the second clamping part 22, the board PCB on which the female engagement member Bf is arranged is coupled to the board PCB on which the male engagement member Bm is arranged. (a1) in FIG. 8 exemplifies a combination of the male engagement member Bm1 in FIG. 2 and the female engagement member Bf1 in FIG. 5. (a2) in FIG. 8 exemplifies a combination of the male engagement member Bm2 in FIG. 3 and the female engagement member Bf1 in FIG. 5. As described above with reference to FIG. 2 and FIG. 3, the male engagement member Bm1 is different from the male engagement member Bm2 in the length of the insertion part 11, for example. In this way, the male engagement members Bm1 and Bm2, and the female engagement member Bf1 can be appropriately combined with each other depending on a distance and the like between the boards to be coupled. (b1) in FIG. 8 exemplifies a state in which the distal end of the insertion part 11 is inserted up to a position being in contact with a bottom part of the reception part 20 of the female engagement member Bf1. (b2) in FIG. 8 exemplifies a state in which the distal end of the insertion part 11 is inserted up to an optional position before being brought into contact with the bottom part of the reception part 20 of the female engagement member Bf1. In this way, a length along which the male engagement members Bm1 and Bm2 are inserted into the female engagement member Bf1, that is, an insertion height, can be appropriately set depending on a distance and the like between the board to be coupled.

In a case of selecting the combination exemplified in FIG. 8 as a combination of the pair of engagement members B constituting the board interconnection structure of the power conversion device 1, man-hours for assembling the power conversion device 1 can be reduced due to easiness of surface implementation.

Figure 9:
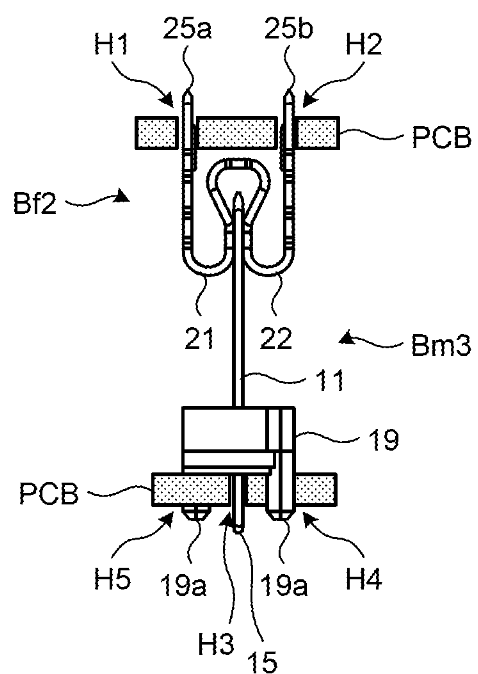
FIG. 9 is a schematic cross-sectional view illustrating an example of an engaged state of the male engagement member in FIG. 4 and the female engagement member in FIG. 6.

FIG. 9 is a schematic cross-sectional view illustrating an example of an engaged state of the male engagement member Bm3 in FIG. 4 and the female engagement member Bf2 in FIG. 6. As illustrated in FIG. 9, when the female engagement member Bf2 clamps the insertion part 11 of the male engagement member Bm3 inserted between the first clamping part 21 and the second clamping part 22, the board PCB on which the female engagement member Bf2 is arranged is coupled to the board PCB on which the male engagement member Bm3 is arranged. As illustrated in FIG. 9, the male engagement member Bm3 is implemented on the printed circuit board in a state in which the connection part 15 is inserted into a hole part H3 arranged at a predetermined position on the printed circuit board, and the insertion parts 19*a* are inserted into hole parts H4 and H5. Specifically, the connection part 15 that is inserted to pass through the printed circuit board is electrically connected to the printed circuit board by dip soldering. The female engagement member Bf2 is implemented on the printed circuit board in a state in which the first connection part 25*a* is inserted into a hole part H1 arranged at a predetermined position on the printed circuit board, and the second connection part 25*b* is inserted into a hole part H2. Specifically, the first connection part 25*a* and the second connection part 25*b* that are inserted to pass through the printed circuit board are electrically connected to the printed circuit board by dip soldering.

In a case of selecting the combination exemplified in FIG. 9 as a combination of the pair of engagement members B constituting the board interconnection structure of the power conversion device 1, the power conversion device 1 capable of handling a large current can be implemented due to high ruggedness of DIP implementation.

Figure 10:
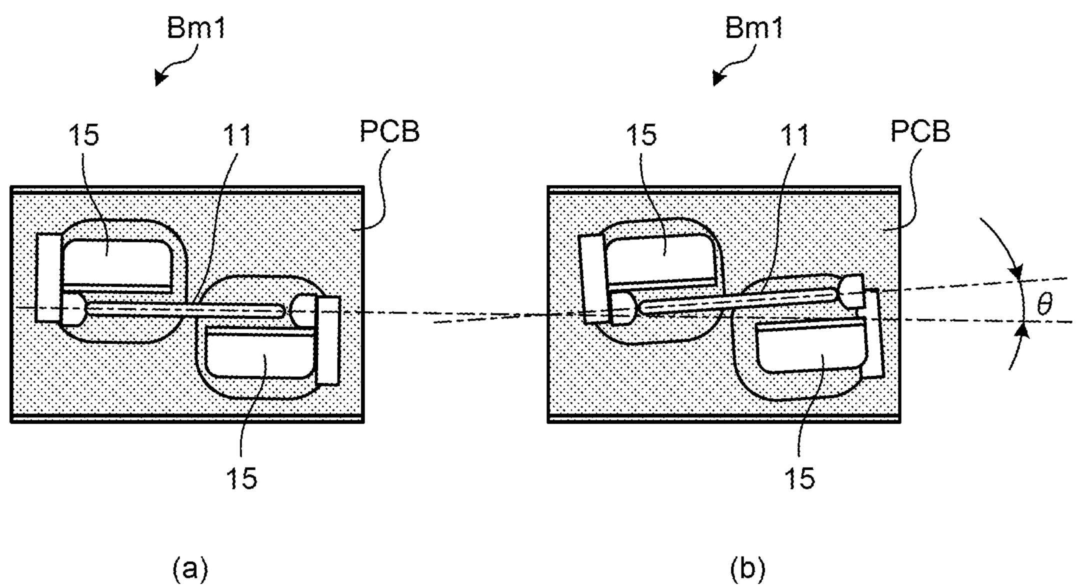
FIG. 10 is a diagram for explaining implementation of the male engagement member according to the first embodiment on the circuit board.
Figure 11:
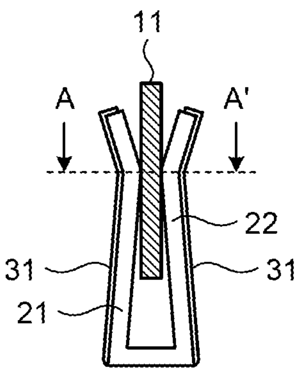
FIG. 11 is a diagram for explaining expansion of a geometric permissible range for engagement between the male engagement member and the female engagement member according to the first embodiment.

FIG. 10 is a diagram for explaining implementation of the male engagement member Bm according to the embodiment on the circuit board. (a) in FIG. 10 exemplifies the male engagement member Bm in a state of being implemented at a predetermined position. (b) in FIG. 10 exemplifies the male engagement member Bm in a state of being rotated by an angle θ from the predetermined position to be implemented. FIG. 11 is a diagram for explaining expansion of the geometric permissible range for engagement between the male engagement member Bm and the female engagement member Bf according to the embodiment. Cross-sectional views in FIG. 11 schematically exemplify cross sections of the engagement part according to the embodiment. In FIG. 11, the A-A' portion indicates a contact portion at which the male engagement member Bm is brought into contact with the female engagement member Bf in the engagement part. In FIG. 11, a top view of the A-A' portion exemplifies a cross-sectional view of the A-A' portion. In this case, "basic" corresponds to the state illustrated in (a) in FIG. 10. "Rotated" corresponds to the state illustrated in (b) in FIG. 10.

As illustrated in FIG. 8 and FIG. 9, the male engagement member Bm implemented on the printed circuit board is inserted into the reception part 20 of the female engagement member Bf. Specifically, the insertion part 11 is inserted to widen an interval between the first clamping part 21 and the second clamping part 22 while being in contact with the first clamping part 21 and the second clamping part 22. However, at the time of implementing the male engagement member Bm on the printer circuit board, as illustrated in FIG. 10 for example, the position of the male engagement member Bm may deviate from an intended position in some cases. Similarly, at the time of implementing the female engagement member Bf on the printer circuit board, positional deviation may be caused in some cases. In such cases, there is the risk that the pair of engagement members B are not appropriately engaged with each other, and a bad connection may be caused between the boards. Even in a case in which each of the male engagement member Bm and the female engagement member Bf is implemented at the predetermined position, there is the risk that the pair of engagement members B are not appropriately engaged with each other, and a bad connection may be caused between the boards depending on position accuracy at the time of assembly.

In such a situation, in the power conversion device 1 according to the embodiment, each of the first clamping part 21 and the second clamping part 22 is bent in a projecting shape toward the reception part 20. That is, as illustrated as the cross-sectional view in FIG. 11, the distal end of the female engagement member Bf is formed in a shape of opening toward the male engagement member Bm. Due to this, the distal end of the female engagement member Bf can guide the insertion part 11 of the male engagement member Bm to the reception part 20. Specifically, even if the insertion part 11 is in the state illustrated in (b) in FIG. 10, the distal end 13 of the insertion part 11 can be inserted into the reception part 20 along an inner wall of the distal end of the female engagement member Bf. Accordingly, with the engagement part according to the embodiment, it is possible to expand a range of relative rotational position deviation between the pair of engagement members B that can be appropriately engaged with each other.

In the power conversion device 1 according to the embodiment, the gap 27 is arranged at the distal end of each of the first clamping part 21 and the second clamping part 22. In other words, the distal end of each of the first clamping part 21 and the second clamping part 22 is divided into at least two parts by the gap 27. That is, the distal end of the female engagement member Bf according to the embodiment is divided into at least four parts. In FIG. 11, the diagram of "rotated" exemplifies a state in which the third elastic portion 22*a* is displaced in a direction of arrow D by receiving force from the insertion part 11 that is rotated and deviated. Additionally, the diagram of "rotated" in FIG. 11 exemplifies a direction of arrow R in which the first elastic portion 21*a* may be deformed by receiving force from the insertion part 11 that is rotated and deviated. In this way, the first elastic portion 21*a*, the second elastic portion 21*b*, the third elastic portion 22*a*, and the fourth elastic portion 22*b*, that is, four divided distal ends, can be independently displaced and/or deformed by receiving force from the insertion part 11. Due to this, even if the insertion part 11 is in the state illustrated in (b) in FIG. 10, the four divided distal ends can be appropriately brought into contact with the insertion part 11 as indicated by a solid-white circle in the diagram of "rotated" in FIG. 11. Thus, with the engagement part according to the embodiment, it is possible to expand the range of relative rotational position deviation between the pair of engagement members B that can implement good connection.

In this way, with the board interconnection structure implemented by the pair of engagement members B according to the embodiment, the geometric permissible range of the engagement part can be expanded.

As illustrated in FIG. 11, the insulator layer 31 is formed on the outer peripheral portion of the female engagement member Bf as an insulation part. Due to this, in a procedure of board interconnection according to the embodiment described below, a board interconnection state can be determined.

Figures 12, 13:
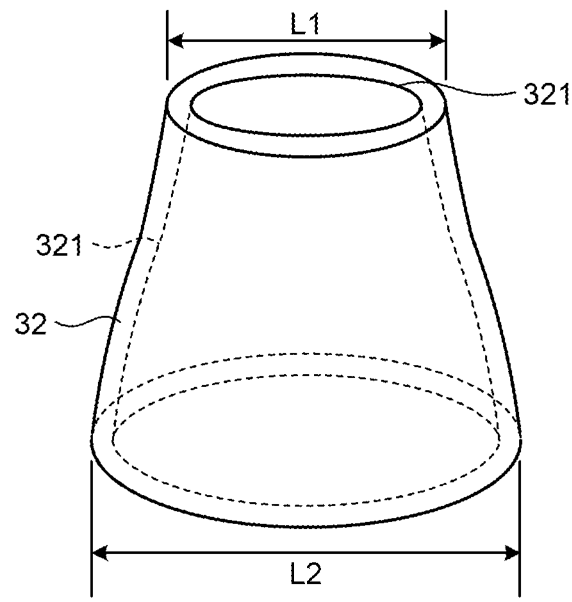
FIG. 12 is a schematic perspective view illustrating another example of an insulation part according to the first embodiment.
FIG. 13 is a diagram for explaining expansion of the geometric permissible range for engagement between the male engagement member and the female engagement member in a case in which a covering member in FIG. 12 is mounted.

The insulation part is not limited to the insulator layer 31, but may be implemented by another configuration. FIG. 12 is a schematic perspective view illustrating another example of the insulation part according to the embodiment. FIG. 13 is a diagram for explaining expansion of the geometric permissible range for engagement between the male engagement member Bm and the female engagement member Bf in a case in which a covering member 32 in FIG. 12 is mounted. As illustrated in FIG. 12, the insulation part may be formed by the covering member 32 mounted on the outer peripheral portion of the female engagement member Bf. The covering member 32 has flexibility. The covering member 32 may also have elasticity. The covering member 32 is formed by an insulator. By way of example, the insulator is an insulating material such as a silicone resin. The covering member 32 is formed in a substantially cylindrical shape. A diameter on an upper end side of the covering member 32, that is, a dimension L1, is smaller than a dimension L2 on a lower end side. Thus, a dimension on the upper end side of an inner peripheral part 321 of the covering member 32 is smaller than a dimension on the lower end side. These dimensions are determined based on the fact that the shape of the outer peripheral portion of the female engagement member Bf is tapered from the lower end side toward the upper end side as illustrated in FIG. 5 and FIG. 6, for example. As illustrated in FIG. 13, when the covering member 32 is mounted on the outer peripheral portion of the female engagement member Bf, the inner peripheral part 321 of the covering member 32 is circumscribed with the first clamping part 21 and the second clamping part 22. As illustrated in FIG. 13, gaps G are present at both ends in a width direction of the insertion part 11. As illustrated in the drawing of "rotated" in FIG. 13, because of a degree of freedom in deformation due to the flexibility of the covering member 32 and the gap G, the covering member 32 can be deformed following each of the four divided distal ends that are independently displaced and/or deformed by the insertion part 11 that is rotated and deviated. Even with this configuration, the board interconnection state can be determined in the procedure of board interconnection according to the embodiment described below. The covering member 32 can implement the insulation part in a state of being fitted to the outer peripheral portion of the female engagement member Bf without a gap only by being mounted on the female engagement member Bf due to flexibility thereof.

Figure 14:
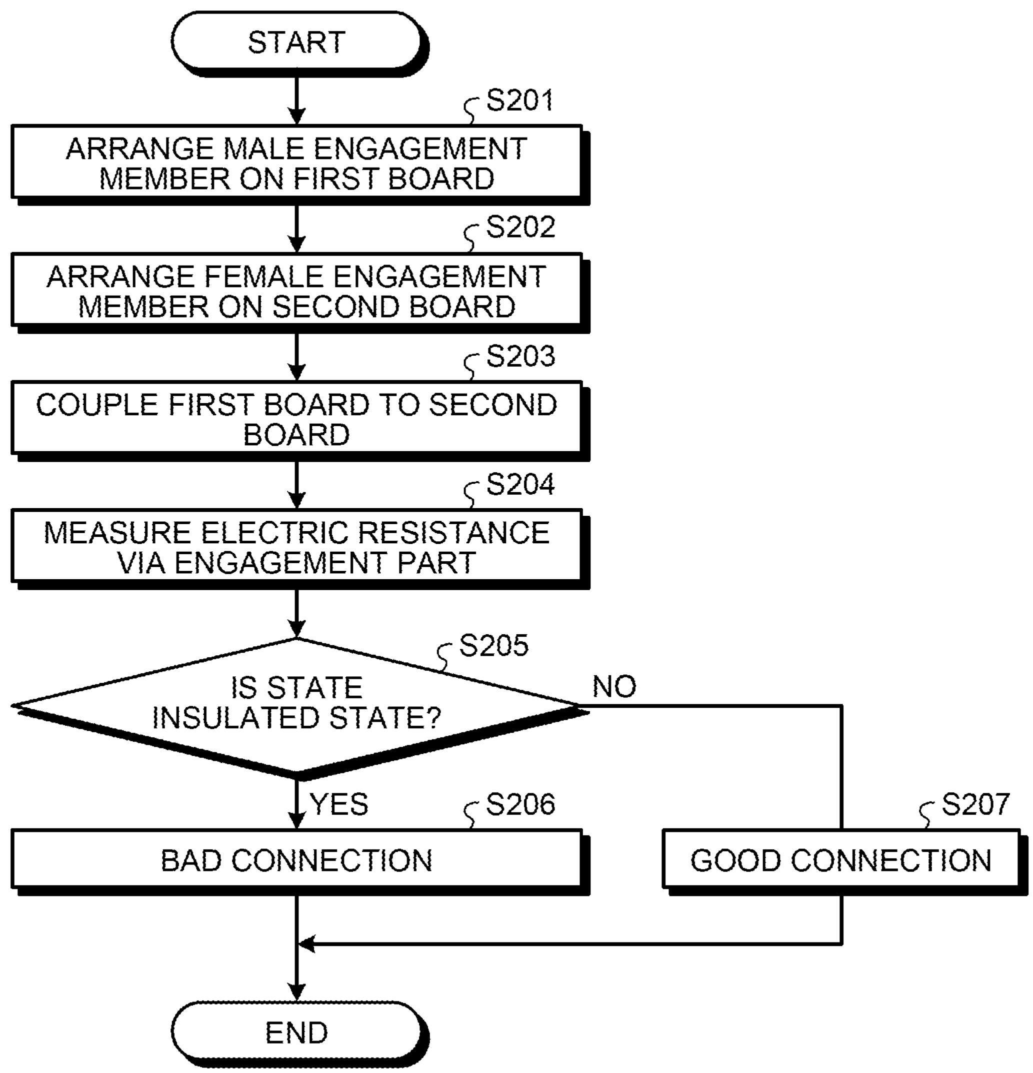
FIG. 14 is a flowchart illustrating an example of a procedure of board interconnection according to the first embodiment.

The following describes an example of the procedure of board interconnection according to the embodiment with reference to the drawings. FIG. 14 is a flowchart illustrating an example of the procedure of board interconnection according to the embodiment.

First, the male engagement member Bm is arranged on a principal plane of the first board PCB1 on the second board PCB2 side (S201). The female engagement member Bf is arranged on a principal plane of the second board PCB2 on the first board PCB1 side (S202). After each of the pair of engagement members B is arranged on the printed circuit board, an implementation state of each of the pair of engagement members B on the printed circuit board is inspected by using Automated Optical Inspection (AOI), for example. In a case in which a failure is detected in the implementation state of each of the pair of engagement members B on the printed circuit board through this inspection, the following procedure will not be performed on the printed circuit board in which the failure is detected.

Subsequently, the first board PCB1 is coupled to the second board PCB2 by engaging the pair of engagement members B (S203). At this step, after contact between the male engagement member Bm and the female engagement member Bf is detected by a sensor, one of the printed circuit boards is pushed against the other one of the printed circuit boards to form a stationary state of a layered structure. The female engagement member Bf has elastic force (spring force) toward the opposite side of an insertion direction of the insertion part 11 of the male engagement member Bm. Thus, when a plurality of the male engagement members Bm are pushed into a plurality of the female engagement members Bf at the same time, some of the male engagement members Bm may come off from the reception part 20 of the female engagement member Bf in some cases. Thus, at this step, after forming a secure engaged state once, one of the printed circuit boards is further pushed into the other one of the printed circuit boards to implement good engagement. In this case, the secure engaged state means a steady state in which the insertion part 11 is pushed into the reception part 20 by about 1 mm, for example.

Subsequently, electric resistance is measured via the engagement part (S204). The measurement of the electric resistance via the engagement part is, for example, measurement of electric resistance between an optional position of a circuit configuration on the first board PCB1 electrically connected to the male engagement member Bm and an optional position of a circuit configuration on the second board PCB2 electrically connected to the female engagement member Bf.

If the electric resistance via the engagement part indicates an insulated state (Yes at S205), it is determined that the engagement part has a bad connection (S206). On the other hand, if the electric resistance via the engagement part does not indicate the insulated state (No at S205), it is determined that the engagement part has a good connection (S207). After S206 or S207, the procedure of FIG. 14 ends.

In this way, with a board interconnection method implemented by using the pair of engagement members B according to the embodiment, the geometric permissible range of the engagement part can be expanded.

As described above, with the power conversion device 1 according to the first embodiment, the geometric permissible range of the engagement part that electrically interconnects the circuit boards can be expanded. Due to this, the circuit boards can be appropriately laminated, so that downsizing of the power conversion device 1 can be achieved.

Second Embodiment

The following describes an embodiment of the power conversion device, the component interconnection structure, and the component interconnection method according to a second embodiment with reference to the drawings. The following mainly describes points of difference from the first embodiment, and redundant description will be appropriately omitted.

Figure 15:
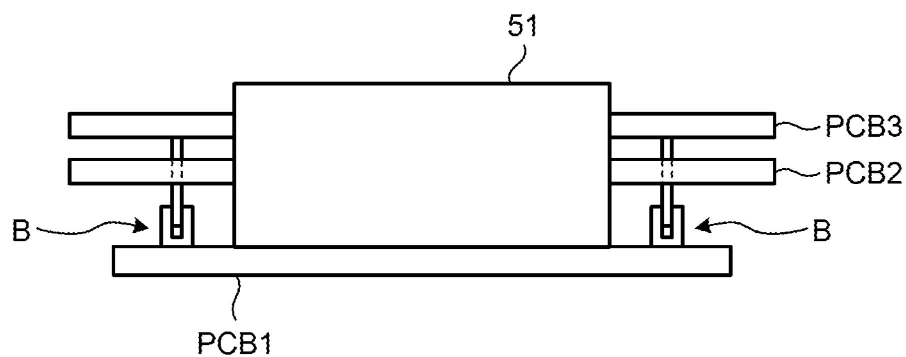
FIG. 15 is a schematic cross-sectional view illustrating an example of a component interconnection structure in a power conversion device according to a second embodiment.

The first embodiment describes the component interconnection structure according to the present disclosure by exemplifying board interconnection, but the embodiment is not limited thereto. The component interconnection structure according to the present disclosure can be applied to a connection between the circuit board and an electronic component, for example. FIG. 15 is a schematic cross-sectional view illustrating an example of the component interconnection structure in the power conversion device 1 according to the second embodiment. FIG. 15 exemplifies the first board PCB1, the multiple pairs of engagement members B, and an electronic component 51.

The electronic component 51 is implemented on the first board PCB1. The electronic component 51 includes the second board PCB2 and the third board PCB3. The electronic component 51 is implemented on the first board PCB1 when the first board PCB1 and the third board PCB3 are coupled to each other via engagement of the multiple pairs of engagement members B.

FIG. 15 exemplifies a case in which the female engagement member is arranged on the first board PCB1, and the male engagement member is arranged on the third board PCB3, but the embodiment is not limited thereto. The male engagement member may be arranged on the first board PCB1, and the female engagement member may be arranged on the third board PCB3. The number of boards included in the electronic component 51 may be one, or may be plural, that is, three or more. For example, the electronic component 51 exemplified in FIG. 15 is a magnetic component such as a transformer, a transformer, a reactor, or a choke. In the board included in the electronic component 51, for example, a conductor pattern forms winding. Additionally, the electronic component 51 has a function as the magnetic component due to a closed magnetic circuit formed by causing a magnetic body core to pass through an inner side and an outer side of the winding formed on the board. In this case, it can be represented that the electronic component 51 is a printed board transformer, or a transformer-integrated printed board.

In this way, the component interconnection structure according to the present disclosure can also be applied to the electrical connection between the circuit board and the electronic component 51. Due to this, implementation density of components such as the electronic component, the circuit board, and the board unit in the power conversion device 1 can be improved, or a degree of freedom in disposition of components can be improved. Improvement in implementation density of the components and improvement in the degree of freedom in disposition each contribute to downsizing of the power conversion device 1.

Third Embodiment

The following describes an embodiment of the power conversion device, the component interconnection structure, and the component interconnection method according to a third embodiment with reference to the drawings. The following mainly describes points of difference from the first embodiment, and redundant description will be appropriately omitted.

Figure 16:
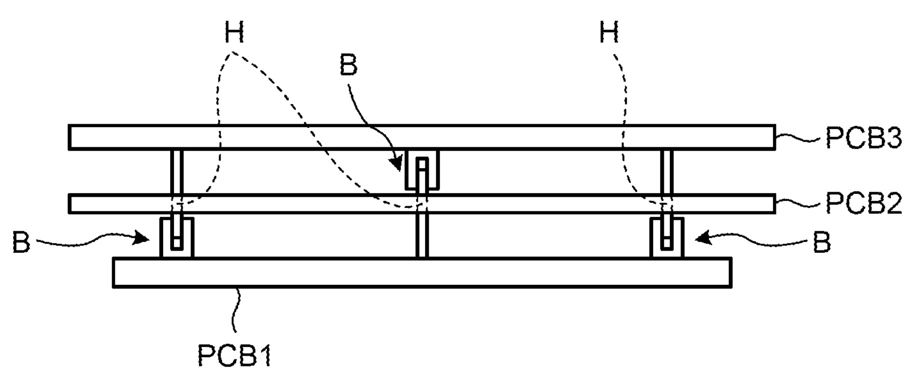
FIG. 16 is a schematic cross-sectional view illustrating an example of a component interconnection structure in a power conversion device according to a third embodiment.

FIG. 16 is a schematic cross-sectional view illustrating an example of the component interconnection structure in the power conversion device 1 according to the third embodiment. FIG. 16 exemplifies the first board PCB1, the second board PCB2, the third board PCB3, and the multiple pairs of engagement members B.

The first board PCB1 and the third board PCB3 are coupled to each other via engagement of the multiple pairs of engagement members B. The second board PCB2 is arranged between the first board PCB1 and the third board PCB3. For example, a plurality of hole parts H are arranged on the second board PCB2. A plurality of the male engagement members arranged on the first board PCB1 or the third board PCB3 pass through the respective hole parts H in an assembled state.

In this way, with the component interconnection structure according to the present disclosure, a board that is not a connection target can be interposed between the boards as connection targets. Obviously, with the component interconnection structure according to the present disclosure, an electronic component or a board unit that is not a connection target can also be interposed between the boards as connection targets. Due to this, it is possible to improve implementation density of components such as the electronic component, the circuit board, and the board unit in the power conversion device 1, or improve the degree of freedom in disposition of the components. Improvement in implementation density of the components and improvement in the degree of freedom in disposition each contribute to downsizing of the power conversion device 1.

FIG. 16 exemplifies a case in which the second board PCB2 that is not a connection target is interposed between the first board PCB1 and the third board PCB3 as connection targets, but the embodiment is not limited thereto. An electronic component or a board unit that is not a connection target can also be interposed between the first board PCB1 and the third board PCB3 as connection targets.

Fourth Embodiment

The following describes an embodiment of the power conversion device, the component interconnection structure, and the component interconnection method according to a fourth embodiment with reference to the drawings. The following mainly describes points of difference from the first embodiment, and redundant description will be appropriately omitted.

Figure 17:
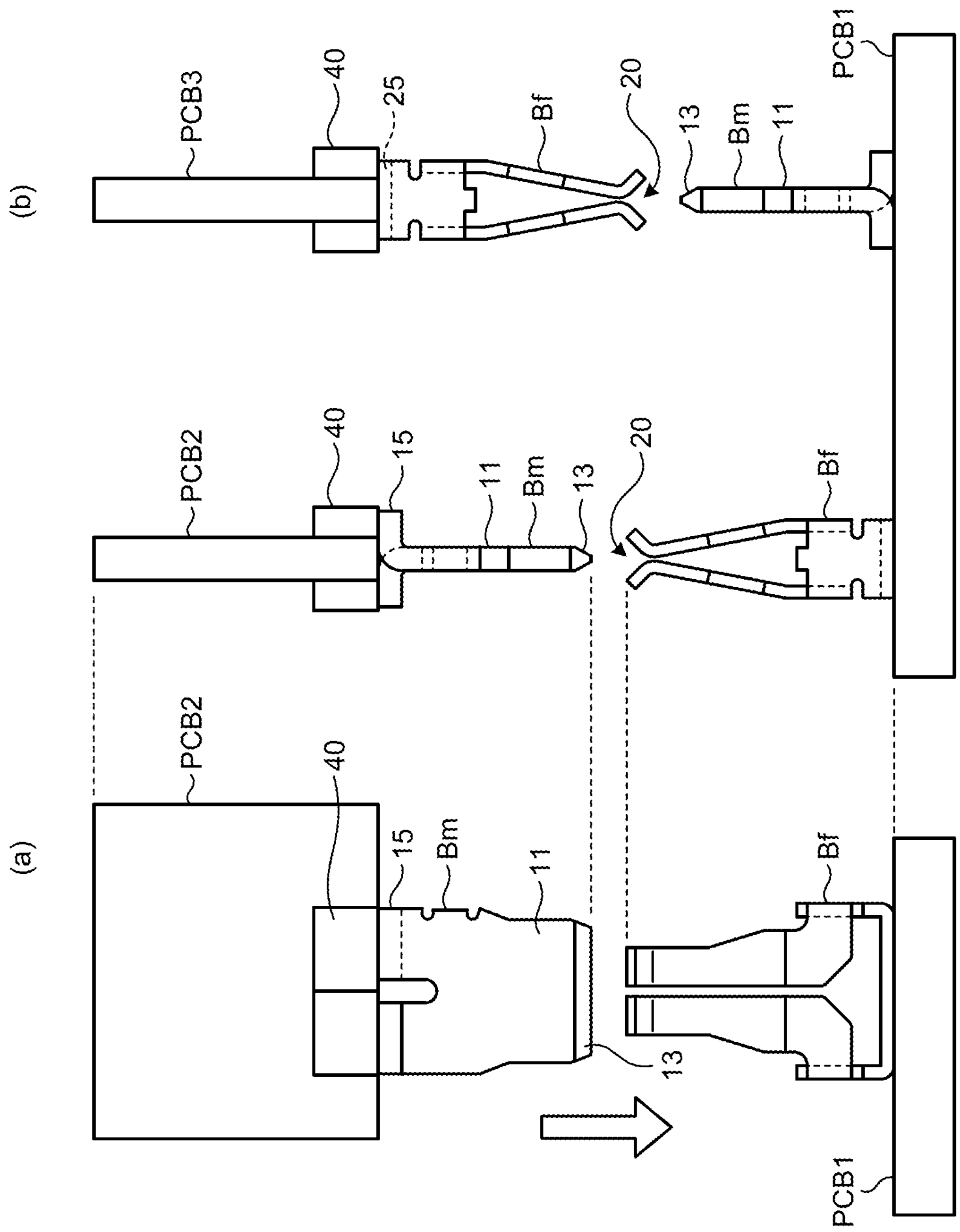
FIG. 17 is a schematic cross-sectional view illustrating an example of a component interconnection structure in a power conversion device according to a fourth embodiment.

The first embodiment exemplifies a case of coupling the pair of circuit boards in substantially parallel via the multiple pairs of engagement members B, but the embodiment is not limited thereto. The pair of circuit boards can be coupled to be substantially perpendicular to each other via the multiple pairs of engagement members B. FIG. 17 is a schematic cross-sectional view illustrating an example of the component interconnection structure in the power conversion device 1 according to the fourth embodiment. FIG. 17 exemplifies a connection between the first board PCB1 and the second board PCB2, and a connection between the first board PCB1 and the third board PCB3.

(a) in FIG. 17 exemplifies a case in which the female engagement member Bf is arranged on the first board PCB1, and the male engagement member Bm is arranged on the second board PCB2. As illustrated in FIG. 17, the male engagement member Bm is arranged at an end part of the second board PCB2. A support member 40 is arranged at the end part of the second board PCB2, and clamps the end part of the second board PCB2. The support member 40 defines an angle of the male engagement member Bm with respect to the second board PCB2. The connection part 15 of the male engagement member Bm is joined to the support member 40. The insertion part 11 of the male engagement member Bm is substantially parallel with a principal plane of the second board PCB2.

In the configuration of (a) in FIG. 17, the male engagement member Bm and the second board PCB2 may be electrically connected to each other via the support member 40.

(b) in FIG. 17 exemplifies a case in which the male engagement member Bm is arranged on the first board PCB1, and the female engagement member Bf is arranged on the third board PCB3. In this case, the support member 40 is arranged at an end part of the third board PCB3, and clamps the end part of the third board PCB3. The support member 40 defines an angle of the female engagement member Bf with respect to the third board PCB3. Unlike (a) in FIG. 17, the connection part 25 of the female engagement member Bf is joined to the support member 40. The reception part 20 of the female engagement member Bf is substantially parallel with a principal plane of the third board PCB3. That is, the principal plane of the third board PCB3 on which the female engagement member Bf is arranged is substantially parallel with the insertion part 11 of the male engagement member Bm to be engaged with the female engagement member Bf.

In the configuration of (b) in FIG. 17, the female engagement member Bf and the third board PCB3 may be electrically connected to each other via the support member 40.

In this way, with the component interconnection structure according to the present embodiment, a pair of components can be coupled to be perpendicular to each other via at least the pair of engagement members B. In other words, with the component interconnection structure according to the present embodiment, a pair of components can be coupled at an angle defined by the support member 40 via at least the pair of engagement members B. Due to this, it is possible to improve implementation density of components such as the electronic component, the circuit board, and the board unit in the power conversion device 1, or improve the degree of freedom in disposition of the components. Improvement in implementation density of the components and improvement in the degree of freedom in disposition each contribute to downsizing of the power conversion device 1.

The support member 40 may be formed integrally with any one of the male engagement member Bm, the female engagement member Bf, and the second board PCB2, or may be formed as a component separated from the male engagement member Bm, the female engagement member Bf, and the second board PCB2.

In the configuration of FIG. 17, the first board PCB1 on which at least one of the male engagement member Bm and the female engagement member Bf is arranged can be replaced with the electronic component 51 on which at least one of the male engagement member Bm and the female engagement member Bf is arranged.

Fifth Embodiment

The following describes an embodiment of the power conversion device, the component interconnection structure, and the component interconnection method according to a fifth embodiment with reference to the drawings. The following mainly describes points of difference from the first embodiment, and redundant description will be appropriately omitted.

Figure 18:
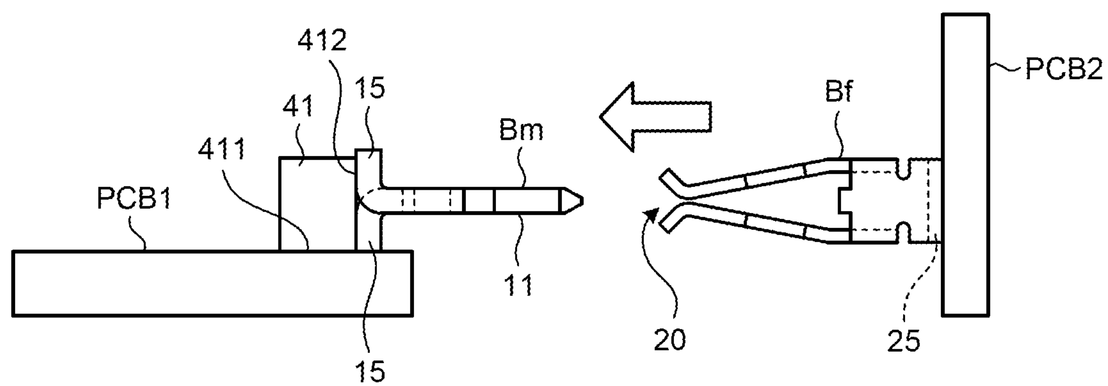
FIG. 18 is a schematic cross-sectional view illustrating an example of a component interconnection structure in a power conversion device according to a fifth embodiment.

FIG. 18 is a schematic cross-sectional view illustrating an example of the component interconnection structure in the power conversion device 1 according to the fifth embodiment. FIG. 18 exemplifies a connection between the first board PCB1 on which the male engagement member Bm is arranged and the second board PCB2 on which the female engagement member Bf is arranged. A support member 41 is arranged on the first board PCB1. The support member 41 defines an angle of the male engagement member Bm with respect to the first board PCB1. The support member 41 has a rectangular parallelepiped shape, for example. A bottom surface 411 of the support member 41 is fixed to the first board PCB1. The connection part 15 of the male engagement member Bm is joined to a side surface 412 of the support member 41. The insertion part 11 of the male engagement member Bm is substantially parallel with a principal plane of the first board PCB1.

Figure 19:
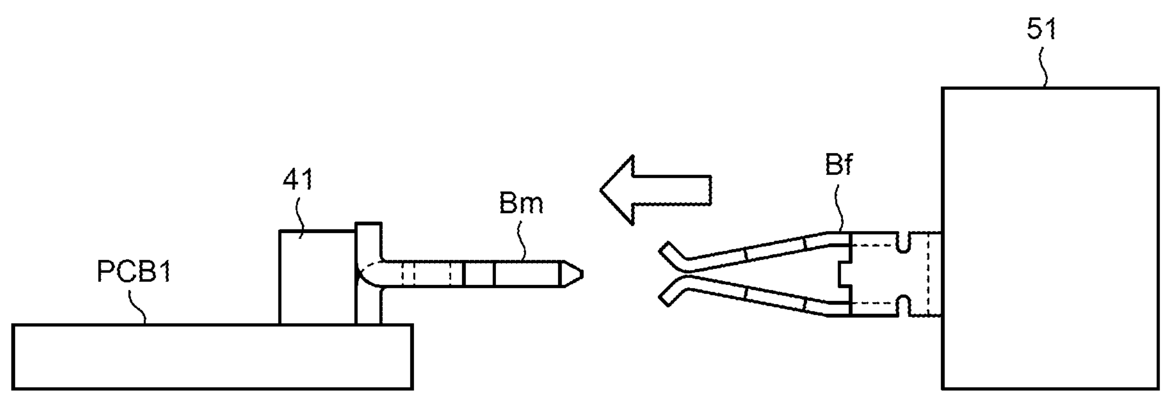
FIG. 19 is a schematic cross-sectional view illustrating another example of the component interconnection structure in the power conversion device according to the fifth embodiment.

FIG. 19 is a schematic cross-sectional view illustrating another example of the component interconnection structure in the power conversion device 1 according to the fifth embodiment. As illustrated in FIG. 19, the first board PCB1 on which the male engagement member Bm is arranged in FIG. 18 can also be electrically connected to the electronic component 51 on which the female engagement member Bf is arranged.

Figure 20:
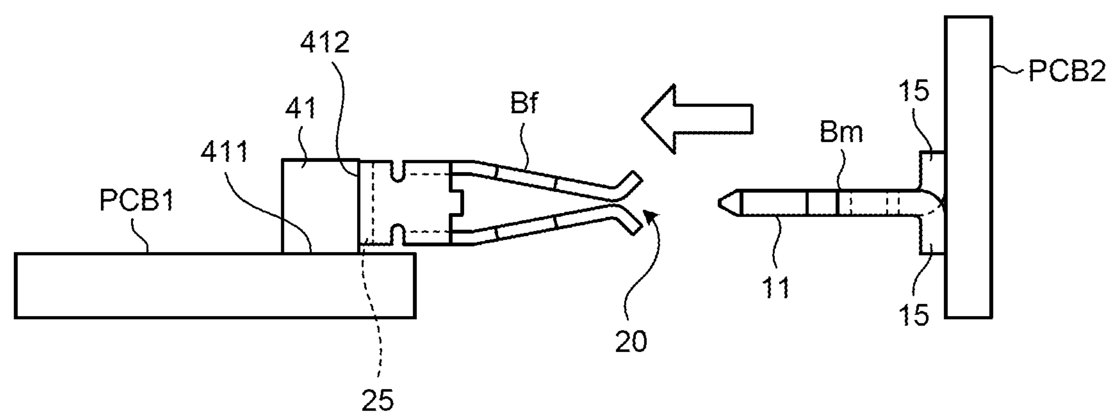
FIG. 20 is a schematic cross-sectional view illustrating another example of the component interconnection structure in the power conversion device according to the fifth embodiment.

In the configuration of FIG. 18, the female engagement member Bf may be joined to the support member 41 of the first board PCB1 instead of the male engagement member Bm. FIG. 20 is a schematic cross-sectional view illustrating another example of the component interconnection structure in the power conversion device 1 according to the fifth embodiment. FIG. 20 exemplifies a connection between the first board PCB1 on which the female engagement member Bf is arranged and the second board PCB2 on which the male engagement member Bm is arranged. In the configuration of FIG. 20, the support member 41 defines an angle of the male engagement member Bm with respect to the first board PCB1. The connection part 25 of the female engagement member Bf is joined to the side surface 412 of the support member 41. The reception part 20 of the female engagement member Bf is substantially parallel with a principal plane of the first board PCB1 on which the female engagement member Bf substantially parallel with the principal plane of the first board PCB1 is arranged, and the insertion part 11 of the male engagement member Bm arranged on the second board PCB2 to be engaged with the female engagement member Bf.

Figure 21:
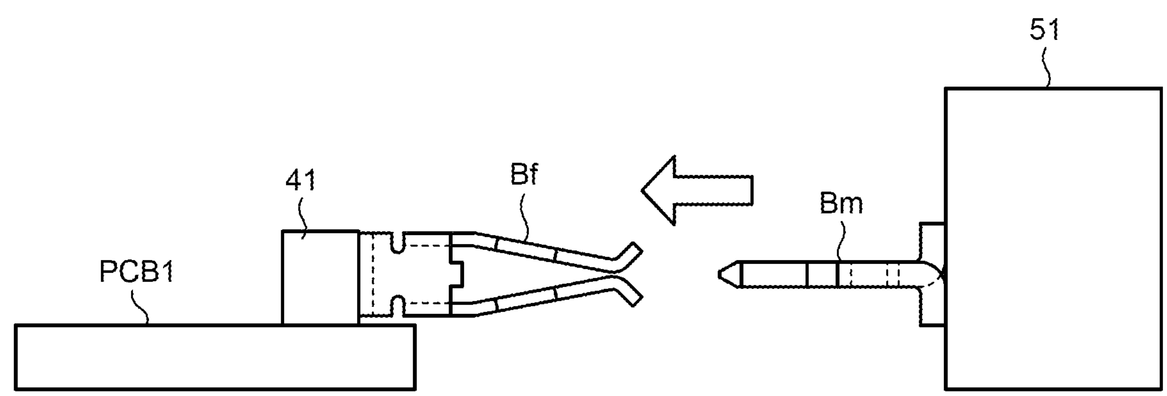
FIG. 21 is a schematic cross-sectional view illustrating another example of the component interconnection structure in the power conversion device according to the fifth embodiment.

FIG. 21 is a schematic cross-sectional view illustrating another example of the component interconnection structure in the power conversion device 1 according to the fifth embodiment. As illustrated in FIG. 21, the first board PCB1 on which the female engagement member Bf is arranged in FIG. 20 can also be electrically connected to the electronic component 51 on which the male engagement member Bm is arranged. The male engagement member Bm may be formed integrally with the electronic component 51. In this case, as illustrated in FIG. 21, the connection part 15 may be arranged inside the electronic component 51.

Figure 22:
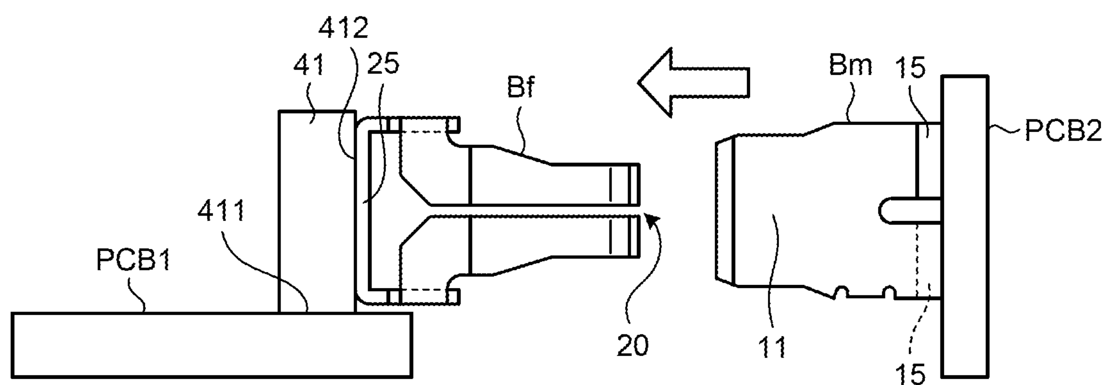
FIG. 22 is a schematic cross-sectional view illustrating another example of the component interconnection structure in the power conversion device according to the fifth embodiment.

In the configuration of FIG. 20, the reception part 20 of the female engagement member Bf may be substantially perpendicular to the principal plane of the first board PCB1. FIG. 22 is a schematic cross-sectional view illustrating another example of the component interconnection structure in the power conversion device 1 according to the fifth embodiment. FIG. 22 exemplifies a connection between the first board PCB1 on which the female engagement member Bf is arranged and the second board PCB2 on which the male engagement member Bm is arranged. Unlike the configurations in FIG. 20 and FIG. 21, the reception part 20 of the female engagement member Bf is substantially perpendicular to the principal plane of the first board PCB1. That is, in the configuration of FIG. 22, the support member 41 defines an angle of the female engagement member Bf with respect to the first board PCB1. The principal plane of the first board PCB1 on which the female engagement member Bf is arranged is substantially perpendicular to the insertion part 11 of the male engagement member Bm arranged on the second board PCB2 to be engaged with the female engagement member Bf.

Figure 23:
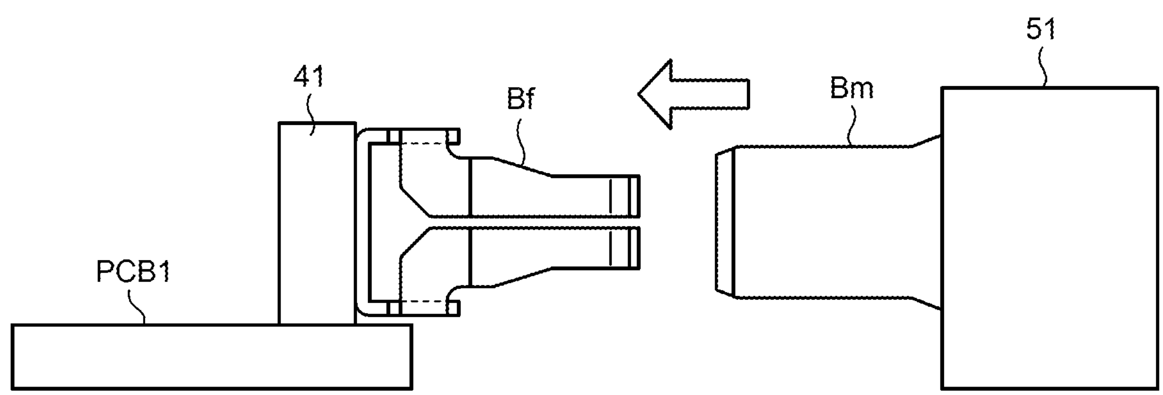
FIG. 23 is a schematic cross-sectional view illustrating another example of the component interconnection structure in the power conversion device according to the fifth embodiment.

FIG. 23 is a schematic cross-sectional view illustrating another example of the component interconnection structure in the power conversion device 1 according to the fifth embodiment. As illustrated in FIG. 23, the first board PCB1 on which the female engagement member Bf is arranged in FIG. 22 can also be electrically connected to the electronic component 51 on which the male engagement member Bm is arranged. Similarly to the configuration of FIG. 21, the male engagement member Bm may be formed integrally with the electronic component 51.

In the configurations of FIG. 18 and FIG. 19, similarly to the configurations of FIG. 22 and FIG. 23, the insertion part 11 of the male engagement member Bm may be substantially perpendicular to the principal plane of the first board PCB1.

In the configurations of FIG. 18 and FIG. 19, the male engagement member Bm and the first board PCB1 may be electrically connected to each other via the support member 41, or may be connected to each other without using the support member 41. Similarly, in the configurations of FIG. 20 to FIG. 23, the female engagement member Bf and the first board PCB1 may be electrically connected to each other via the support member 41, or may be electrically connected to each other without using the support member 41. In the configurations of FIG. 20 to FIG. 23, in a case in which the female engagement member Bf and the first board PCB1 are electrically connected to each other without using the support member 41, an optional position on a rear end side of the female engagement member Bf may be electrically connected to the first board PCB1, the optional position such as the first base 26*a* or the second base 26*b* on the rear end side of the female engagement member Bf1, or a side surface of the connection part 25 on the rear end side of the female engagement member Bf2.

In the configurations of FIG. 18 to FIG. 23, the first board PCB1 and the support member 41 may be integrally formed, or may be formed as separated components. In the configurations of FIG. 18 and FIG. 19, the male engagement member Bm and the support member 41 may be integrally formed, or may be formed as separated components. In the configurations of FIG. 20 to FIG. 23, the female engagement member Bf and the support member 41 may be integrally formed, or may be formed as separated components.

In this way, with the component interconnection structure according to the present embodiment, the pair of components can be coupled to be perpendicular to each other via at least the pair of engagement members B. In other words, with the component interconnection structure according to the present embodiment, the pair of components can be coupled at an angle defined by the support member 41 via at least the pair of engagement members B.

Sixth Embodiment

The following describes an embodiment of the power conversion device, the component interconnection structure, and the component interconnection method according to a sixth embodiment with reference to the drawings. The following mainly describes points of difference from the first embodiment, and redundant description will be appropriately omitted.

Figure 24:
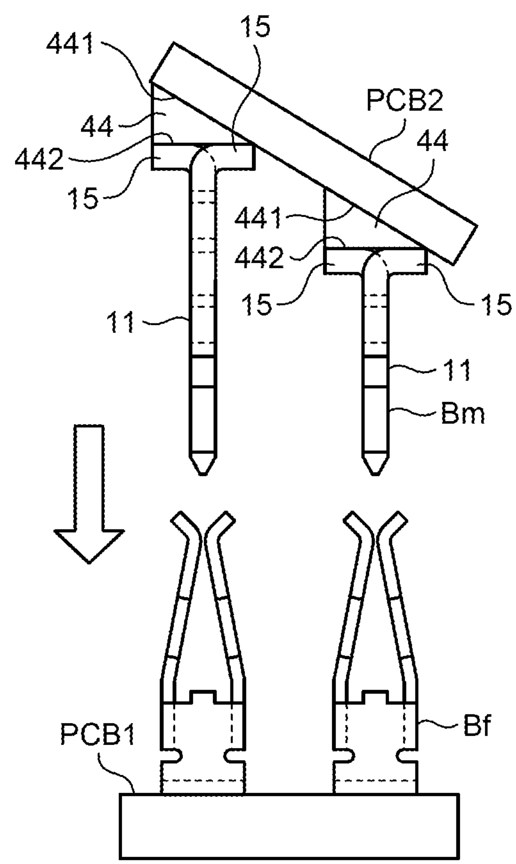
FIG. 24 is a schematic cross-sectional view illustrating an example of a component interconnection structure in a power conversion device according to a sixth embodiment.

The first embodiment exemplifies a case in which the pair of circuit boards are coupled in substantially parallel with each other via the multiple pairs of engagement members B, but the embodiment is not limited thereto. The pair of circuit boards can be coupled at an optional angle via the multiple pairs of engagement members B. FIG. 24 is a schematic cross-sectional view illustrating an example of the component interconnection structure in the power conversion device according to the sixth embodiment. FIG. 24 exemplifies a connection between the first board PCB1 on which the female engagement member Bf is arranged and the second board PCB2 on which the male engagement member Bm is arranged.

A support member 44 is arranged on the second board PCB2. The support member 44 is arranged on the principal plane of the second board PCB2. The support member 44 defines an angle of the male engagement member Bm with respect to the second board PCB2. The support member 44 has a triangular column shape, for example. A first side surface 441 having a rectangular shape of the support member 44 is fixed to the second board PCB2. The connection part 15 of the male engagement member Bm is joined to a second side surface 442 having a rectangular shape of the support member 44. The insertion part 11 of the male engagement member Bm is substantially parallel with the principal plane of the first board PCB1, and has an optional angle with respect to the principal plane of the second board PCB2, the optional angle corresponding to a triangular shape of a bottom surface of the support member 44, that is, an angle formed by the side surfaces 441 and 442.

In this way, with the component interconnection structure according to the present embodiment, the pair of components can be coupled at an optional angle defined by the support member 44 via at least the pair of engagement members B. Due to this, it is possible to improve implementation density of components such as the electronic component, the circuit board, and the board unit in the power conversion device 1, or improve the degree of freedom in disposition of the components. Improvement in implementation density of the components and improvement in the degree of freedom in disposition each contribute to downsizing of the power conversion device 1.

In the configuration of FIG. 24, the support member 44 may be arranged between the first board PCB1 and the female engagement member Bf. That is, the support member 44 may be a member that defines an angle of the female engagement member Bf with respect to the first board PCB1. The support member 44 may be arranged on both of the first board PCB1 and the second board PCB2.

In the configuration of FIG. 24, the support member 44 may be formed integrally with any one of the male engagement member Bm and the second board PCB2, or may be formed as a component separated from the male engagement member Bm and the second board PCB2.

In the configuration of FIG. 24, at least one of the first board PCB1 and the second board PCB2 can be replaced with the electronic component 51.

Seventh Embodiment

The following describes an embodiment of the power conversion device, the component interconnection structure, and the component interconnection method according to a seventh embodiment with reference to the drawings. The following mainly describes points of difference from the first embodiment, and redundant description will be appropriately omitted.

Figure 25:
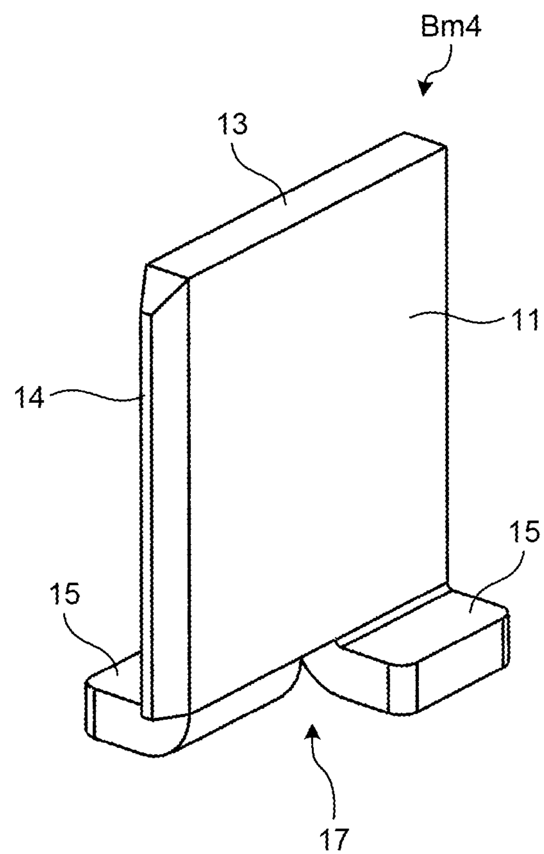
FIG. 25 is a schematic perspective view illustrating an example of a configuration of a male engagement member according to a seventh embodiment.

FIG. 25 is a schematic perspective view illustrating an example of a configuration of the male engagement member Bm according to the seventh embodiment. A male engagement member Bm4 in FIG. 25 is an example of the male engagement member Bm according to the embodiment. A side surface part 14 of the male engagement member Bm4 is chamfered similarly to the distal end 13 of the male engagement member Bm according to the first embodiment, and the thickness thereof is reduced as coming closer to a distal end side. Due to this, the insertion part 11 can be easily inserted into the reception part 20 of the female engagement member Bf from the side surface side.

Figure 26:
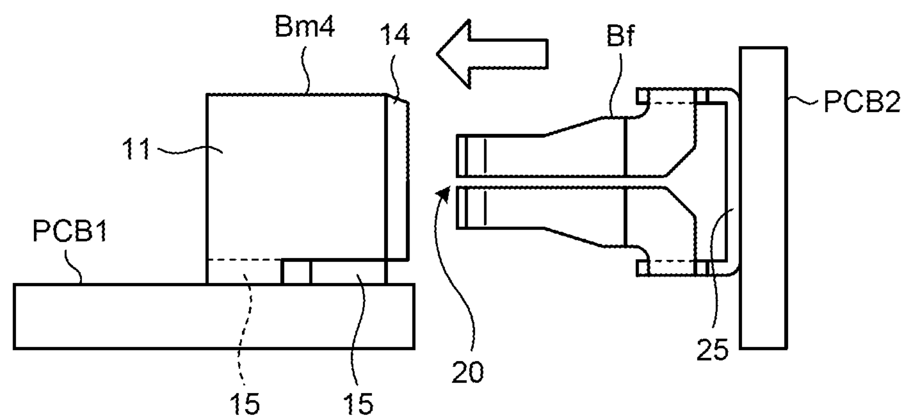
FIG. 26 is a schematic cross-sectional view illustrating an example of a component interconnection structure in a power conversion device according to the seventh embodiment.

FIG. 26 is a schematic cross-sectional view illustrating an example of the component interconnection structure in the power conversion device 1 according to the seventh embodiment. FIG. 26 exemplifies a connection between the first board PCB1 on which the male engagement member Bm4 is arranged and the second board PCB2 on which the female engagement member Bf is arranged. The male engagement member Bm4 is joined to the first board PCB1 at the connection part 15. The insertion part 11 of the male engagement member Bm4 is substantially perpendicular to the respective principal planes of the first board PCB1 and the second board PCB2.

Figure 27:
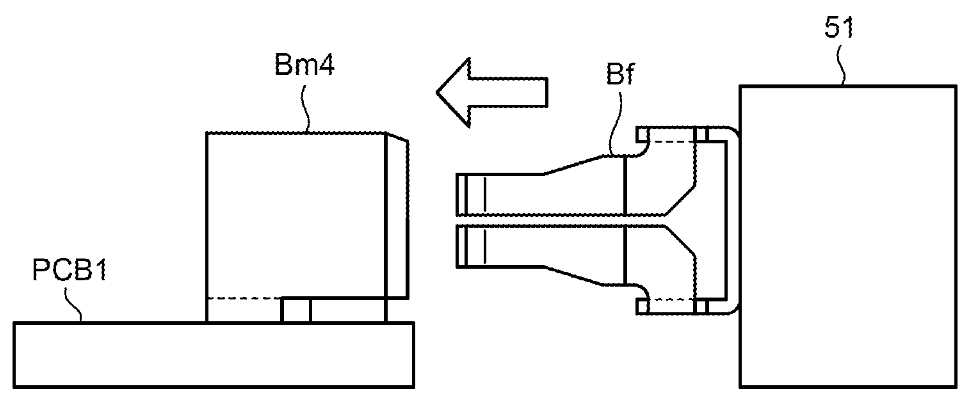
FIG. 27 is a schematic cross-sectional view illustrating another example of the component interconnection structure in the power conversion device according to the seventh embodiment.

FIG. 27 is a schematic cross-sectional view illustrating another example of the component interconnection structure in the power conversion device 1 according to the seventh embodiment. As illustrated in FIG. 27, the second board PCB2 on which the male engagement member Bm4 is arranged in FIG. 26 can also be electrically connected to the electronic component 51 on which the female engagement member Bf is arranged.

Figure 28:
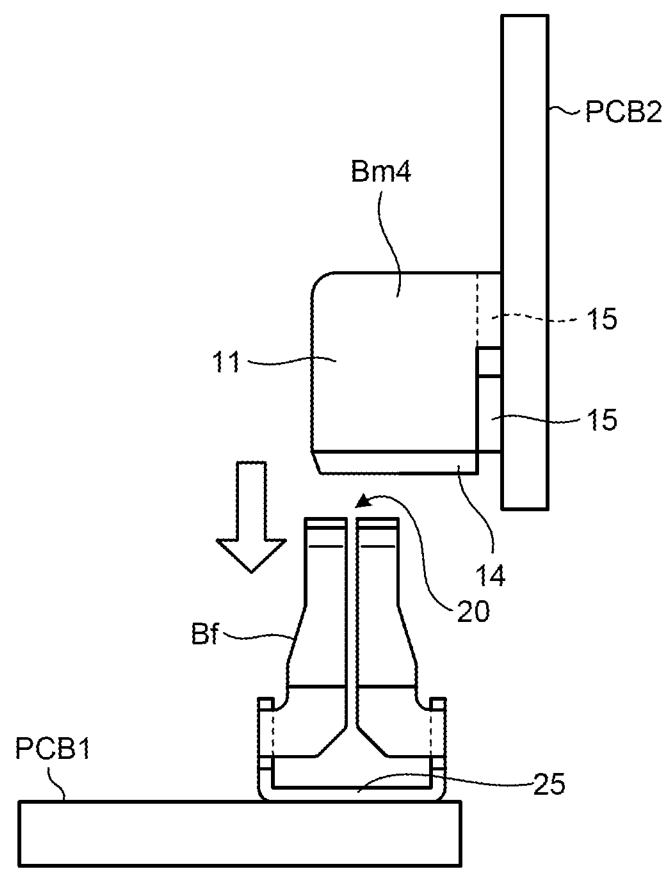
FIG. 28 is a schematic cross-sectional view illustrating another example of the component interconnection structure in the power conversion device according to the seventh embodiment.

FIG. 28 is a schematic cross-sectional view illustrating another example of the component interconnection structure in the power conversion device 1 according to the seventh embodiment. FIG. 28 exemplifies a connection between the first board PCB1 on which the female engagement member Bf is arranged and the second board PCB2 on which the male engagement member Bm4 is arranged. The insertion part 11 of the male engagement member Bm4 is substantially perpendicular to the respective principal planes of the first board PCB1 and the second board PCB2. In the configuration of FIG. 28, a moving direction of the second board PCB2 in assembling the second board PCB2 to the first board PCB1 is different from that in the configuration of FIG. 26.

Figure 29:
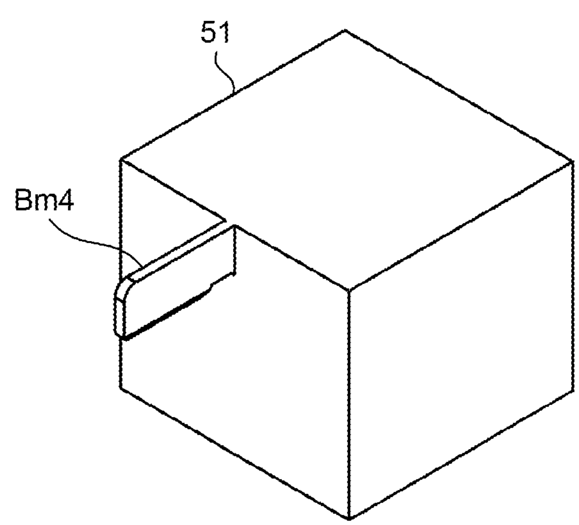
FIG. 29 is a schematic perspective view illustrating an example of an electronic component on which the male engagement member according to the seventh embodiment is implemented.
Figure 30:
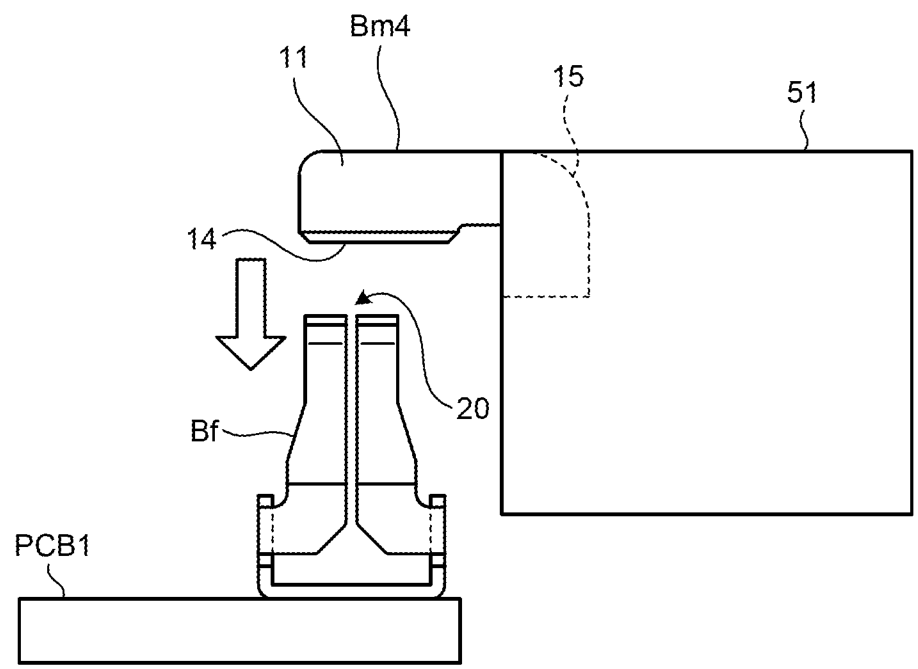
FIG. 30 is a schematic cross-sectional view illustrating another example of the component interconnection structure in the power conversion device according to the seventh embodiment.

The first board PCB1 on which the female engagement member Bf is arranged in FIG. 28 can also be electrically connected to the electronic component 51 on which the male engagement member Bm4 is arranged. FIG. 29 is a schematic perspective view illustrating an example of the electronic component 51 on which the male engagement member Bm4 according to the seventh embodiment is implemented. In the configuration of FIG. 29, the male engagement member Bm4 is configured integrally with the electronic component 51. FIG. 30 is a schematic cross-sectional view illustrating another example of the component interconnection structure in the power conversion device 1 according to the seventh embodiment. FIG. 30 exemplifies a connection between the first board PCB1 on which the female engagement member Bf is arranged and the electronic component 51 on which the male engagement member Bm4 is formed.

In this way, with the component interconnection structure according to the present embodiment, the pair of components can be coupled to be substantially perpendicular to each other via at least the pair of engagement members B. A direction of assembling the components can be changed by changing a side of components to be connected on which the male engagement member Bm4 is arranged. Due to this, the degree of freedom in arranging components in the power conversion device 1 can be improved.

Eighth Embodiment

The following describes an embodiment of the power conversion device, the component interconnection structure, and the component interconnection method according to an eighth embodiment with reference to the drawings. The following mainly describes points of difference from the first embodiment, and redundant description will be appropriately omitted.

Figure 31:
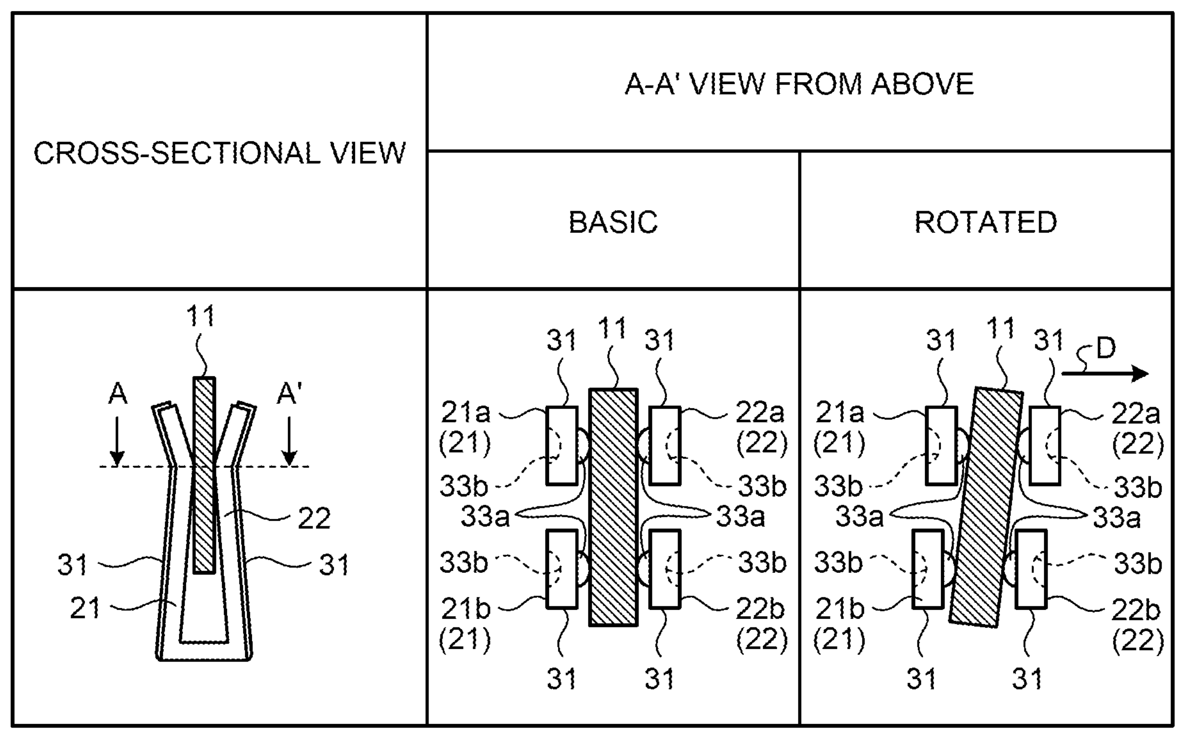
FIG. 31 is a diagram for explaining expansion of a geometric permissible range for engagement between a male engagement member and a female engagement member according to an eighth embodiment.

FIG. 31 is a diagram for explaining expansion of the geometric permissible range for engagement between the male engagement member Bm and the female engagement member Bf according to the eighth embodiment. Cross-sectional views in FIG. 31 schematically exemplify cross sections of the engagement part according to the embodiment. In FIG. 31, the A-A' portion indicates a contact portion at which the male engagement member Bm is brought into contact with the female engagement member Bf in the engagement part. In FIG. 31, a top view of the A-A' portion exemplifies a cross-sectional view of the A-A' portion. In this case, similarly to FIG. 11, “basic” corresponds to the state illustrated in (a) in FIG. 10. Similarly to FIG. 11, "rotated" corresponds to the state illustrated in (b) in FIG. 10.

On each of the first clamping part 21 and the second clamping part 22 of the female engagement member Bf according to the present embodiment, as illustrated in FIG. 31, a projecting portion 33*a* having a substantially hemispherical shape bulging toward the reception part 20 is arranged at the engagement part that is bent in a projecting shape toward the reception part 20. Each projecting portion 33*a* can be formed by press working, for example. In this case, on each of the first clamping part 21 and the second clamping part 22, a recessed part 33*b* recessed in a hemispherical shape is arranged on the opposite side of each projecting portion 33*a*.

With this configuration, even in a case in which the four divided distal ends of the female engagement member Bf are independently displaced and/or deformed by receiving force from the insertion part 11 of the male engagement member Bm, the projecting portion 33*a* having the substantially hemispherical shape can be continuously in contact with the insertion part 11. That is, with the configuration according to the present embodiment, the contact state between the male engagement member Bm and the female engagement member Bf can be maintained in a point contact mode. Due to this, an electrical contact between the male engagement member Bm and the female engagement member Bf can be stabilized.

Application Example

Figure 32:
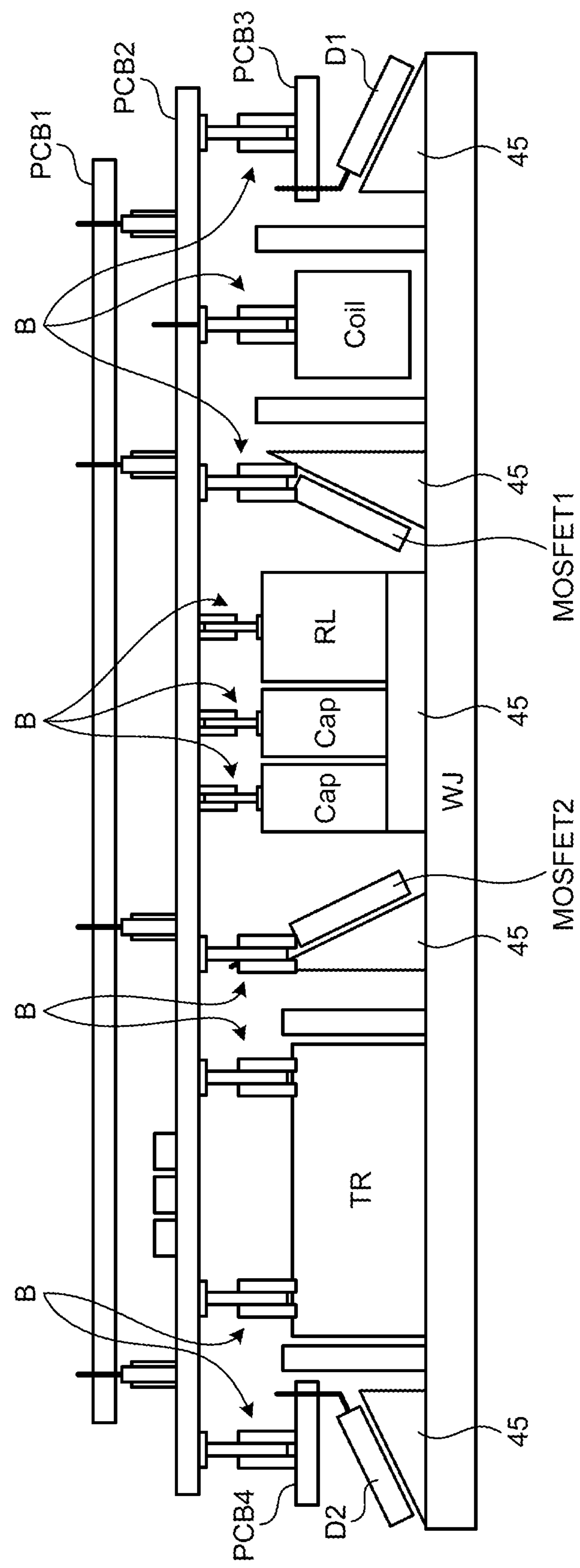
FIG. 32 is a schematic cross-sectional view illustrating an example of a configuration of the power conversion device according to the embodiments.

FIG. 32 is a schematic cross-sectional view illustrating an example of a configuration of the power conversion device 1 according to the embodiments. FIG. 32 exemplifies the first board PCB1, the second board PCB2, the third board PCB3, the fourth board PCB4, and a cooling plate WJ. Various kinds of electronic components 51 can be implemented on these boards with component interconnection structures according to the respective embodiments described above. In FIG. 32, for schematically illustrating each member while securing ease of viewing, a gap may be present between members that are actually in contact with each other by fastening or sticking. By way of example, the cooling plate WJ is a plate member made of metal in which a flow channel for a coolant is formed. As the cooling plate WJ, not only the metal plate including the flow channel for a coolant therein but also a heat sink, a heat pipe, a nonmetallic thermal diffusion plate, a metal housing, a combination thereof, or the like can be appropriately used. In this case, using a metal housing is not limited to a case of using a metallic plate member not including the flow channel for a coolant therein as the cooling plate WJ, but includes a case of forming a housing of the power conversion device 1 by metal, and using part of the housing as the cooling plate WJ.

For example, the electronic component 51 includes at least one of a semiconductor element, a semiconductor module, a magnetic body, a capacitor, and a breaker. The semiconductor module is constituted of a plurality of semiconductor elements, for example. In this case, the magnetic body is a transformer, a transformer integral-type printed board, a transformer, a reactor, and a choke. The breaker is a relay or a fuse. FIG. 32 exemplifies a transformer TR and a coil Coil as magnetic bodies. FIG. 32 also exemplifies transistors MOSFET1 and MOSFET2, and diodes D1 and D2 as semiconductor modules or semiconductor elements. FIG. 32 also exemplifies a plurality of capacitors Cap. FIG. 32 also exemplifies a relay RL.

In the power conversion device 1, a loss in operation of the semiconductor element, the semiconductor module, the magnetic body, the capacitor, and the breaker exemplified as the electronic components 51 is large, and a component temperature thereof tends to be high. Thus, to efficiently cool the electronic component 51, each of the electronic components 51 is preferably implemented to be closer to the cooling plate WJ.

In the related art, in assembling the power conversion device 1 having the configuration as exemplified in FIG. 32, first, the electronic component 51 is fastened to the cooling plate WJ with a screw and the like, or stuck to the cooling plate WJ with a thermal interface material (TIM), and the boards PCB2, PCB3, and PCB4 are soldered to the electronic component 51 to be implemented thereafter. In this case, there has been the problem that a large-sized soldering facility is required, a solder ball and the like may be contaminated, or the like in view of assembly and quality.

Under such a situation, the connection structure according to the present disclosure enables components to be freely arranged while maintaining both of assemblability and component cooling performance. Specifically, the electronic component 51 and the boards PCB2, PCB3, and PCB4 can be easily and securely connected to each other by coupling the boards PCB2, PCB3, and PCB4 to the electronic component 51 via the engagement member B after fastening the electronic component 51 to the cooling plate WJ with a screw and the like, or sticking the electronic component 51 to the cooling plate WJ with the TIM.

The electronic component 51 may be arranged on the board via a support member 45 so that the male engagement member Bm or the female engagement member Bf is arranged on the board via the support member 41 in the fifth embodiment, for example, or the male engagement member Bm or the female engagement member Bf is arranged on the board via the support member 44 in the sixth embodiment. That is, the electronic component 51 may be fastened to the cooling plate WJ with a screw and the like via the support member 45, or the electronic component 51 may be stuck to the cooling plate WJ with the TIM via the support member 45.

In this case, the support member 45 is a member that thermally connects the electronic component 51 with the cooling plate WJ. Thus, a shape and material of the support member 45 may be appropriately selected so that an amount of heat transfer from the electronic component 51 to the cooling plate WJ becomes large. By way of example, in a case in which the electronic component 51 is electrically insulated from the cooling plate WJ, the support member 45 can be made of metal. Obviously, another metallic material may be used for the support member 45. The support member 45 may be formed integrally with the cooling plate WJ, or a flow channel for a coolant may be arranged within the support member 45. Shapes and materials of the support members 19, 40, 41, and 44 according to the respective embodiments described above may be appropriately selected so that an amount of heat transfer from the electronic component 51 to the boards PCB1, PCB2, PCB3, and PCB4 via the pair of engagement members B becomes large. In this case, heat generated by the electronic component 51 can be diffused or radiated by using the board.

As described above, with the power conversion device 1 according to the present disclosure, the geometric permissible range of the engagement part that electrically interconnects the components can be expanded.

As described above, the component interconnection structure according to the present disclosure is a structure that interconnects optional components to be connected among the electronic component, the circuit board, and the board unit. By way of example, the component interconnection structure is a connection structure between the circuit boards. By way of another example, the component interconnection structure is a connection structure between the electronic component and the circuit board or the board unit. By way of another example, the component interconnection structure is a connection structure between the circuit board and the board unit.

The techniques according to the respective embodiments described above can be optionally combined with each other. For example, in the multiple pairs of engagement members B for connecting the pair of circuit boards, different component interconnection structures may be applied to the respective pairs of engagement members B. For example, two or more circuit boards to be coupled to an optional circuit board may have different angles with respect to the optional circuit board.

In the description of the present disclosure, a constituent element having the same or substantially the same function as that is previously described with reference to the previously described drawing may be denoted by the same reference numeral, and description thereof may be appropriately omitted. Even in a case of representing the same or substantially the same portion, dimensions or ratios may be different between the drawings in some cases. For example, in view of securing visibility of the drawing, a reference numeral may be added to only a principal constituent element in the description of each drawing, and a reference numeral is not necessarily added to a constituent element having the same or the substantially the same function as that is previously described with reference to the previously described drawing.

With the power conversion device and the component interconnection structure according to the present disclosure, it is possible to expand the geometric permissible range of the engagement part that electrically interconnects the components.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A power conversion device comprising:

a first component;

a second component;

a third component coupled to the second component and a plurality of pairs of engagement members each including:

a male engagement member including an insertion part having a substantially flat plate shape; and a female engagement member including a first clamping part and a second clamping part that are arranged to be opposed to each other, the first clamping part includes a first elastic portion and a second elastic portion that are divided by a gap and each of the first and second elastic portions is extended from a first connection part for a fourth component provided on a rear end side of the female engagement member, and the second clamping part includes a third elastic portion and a fourth elastic portion that are divided by a gap and each of the third and fourth elastic portions is extended from a second connection part for the fourth component provided on the rear end side of the female engagement member, wherein:

in each of the plurality of pairs of engagement members, the male engagement member is arranged on a first one of the first and second components, and the female engagement member is arranged on a second one of the first and second components, and the first and second components are coupled to each other when the female engagement member clamps the insertion part of the male engagement member inserted between the first and second clamping parts in each of the plurality of pairs of engagement members, each of the first and second clamping parts is bent to form a projecting portion toward an opposed surface, and the gap dividing the first elastic portion and the second elastic portion is provided at a distal end of the first clamping part and the gap dividing the third elastic portion and the fourth elastic portion is provided at a distal end of the second clamping part the plurality of pairs of engagement members are further arranged between the second and third components, and in each of the plurality of pairs of engagement members arranged between the second and third components, the male engagement member is arranged on a first one of the second and third components, and the female engagement member is arranged on a second one of the second and third components.

2. The power conversion device according to claim 1, wherein each of the first and second components is a board, and the first component is coupled to the second component to be substantially perpendicular to each other.

3. The power conversion device according to claim 1, wherein each of the first component, the second component, and the third component is a board, the first component, the second component, and the third component form a layered structure including three layers, and at least one of the male engagement member and the female engagement member is arranged on both surfaces of the second component forming an intermediate layer of the layered structure.

4. The power conversion device according to claim 1, wherein the projecting portion formed on each of the first and second clamping parts has a substantially hemispherical shape.

5. The power conversion device according to claim 1, wherein an insulator layer is formed on an outer peripheral portion of the female engagement member.

6. The power conversion device according to claim 1, further comprising:

a support member that is provided between a fifth component provided on a rear end side of the male engagement member or the female engagement member and a third connection part for the fifth component in at least a pair of engagement members among the plurality of pairs of engagement members, and the support member defining an angle of the male engagement member or the female engagement member with respect to the fifth component.

7. The power conversion device according to claim 6, wherein each of the first and second components is a board, and the first component is coupled to the second component at an angle defined by the support member.

8. The power conversion device according to claim 1, wherein at least one of the first component, the second component, and the third component is a printed circuit board.

9. The power conversion device according to claim 8, wherein each of the male engagement member and the female engagement member is electrically connected to the printed circuit board by soldering.

10. The power conversion device according to claim 1, wherein each of the first component, the second component, and the third component is one of an electronic component, a board, or a board unit.

11. The power conversion device according to claim 10, wherein the electronic component includes at least one of a semiconductor element, a semiconductor module, a magnetic body, a capacitor, and a breaker.

12. The power conversion device according to claim 1, wherein each of the male engagement member and the female engagement member is made of metallic material.

13. The power conversion device according to claim 12, wherein conductor plating is applied to a part or an entire region of a surface region of the metallic material.

14. A component interconnection structure comprising:

a plurality of pairs of engagement members each including:

a male engagement member including an insertion part having a substantially flat plate shape; and a female engagement member including a first clamping part and a second clamping part that are arranged to be opposed to each other, the female engagement member clamping the insertion part of the male engagement member inserted between the first and second clamping parts, wherein:

in each of the plurality of pairs of engagement members, the male engagement member is arranged on a first one of a first component and a second component, the female engagement member is arranged on a second one of the first component and the second component, each of the first and second clamping parts is bent to form a projecting portion toward an opposed surface, and a gap is provided at a distal end of each of the first and second clamping parts, the plurality of pairs of engagement members are further arranged between the second component and a third component that is coupled to the second component, and in each of the plurality of pairs of engagement members arranged between the second and third components, the male engagement member is arranged on a first one of the second and third components, and the female engagement member is arranged on a second one of the second and third components.

15. The component interconnection structure according to claim 14, wherein the projecting portion formed on each of the first and second clamping parts has a substantially hemispherical shape.

16. The component interconnection structure according to claim 14, wherein each of the first, second, and third components is one of an electronic component, a board, or a board unit.

* * * * *